United States Patent
Wu et al.

(10) Patent No.: US 11,152,338 B2
(45) Date of Patent: Oct. 19, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Zhi-Qiang Wu, Chubei (TW); Chun-Fu Cheng, Zhubei (TW); Chung-Cheng Wu, Ju-Bei (TW); Yi-Han Wang, Beigang Township, Yunlin County (TW); Chia-Wen Liu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/889,498

(22) Filed: Jun. 1, 2020

(65) Prior Publication Data

US 2020/0294973 A1    Sep. 17, 2020

Related U.S. Application Data

(62) Division of application No. 15/794,286, filed on Oct. 26, 2017, now Pat. No. 10,672,742.

(51) Int. Cl.
*H01L 29/66* (2006.01)
*H01L 29/423* (2006.01)
(Continued)

(52) U.S. Cl.
CPC .... *H01L 25/0657* (2013.01); *H01L 21/02008* (2013.01); *H01L 21/823807* (2013.01);
(Continued)

(58) Field of Classification Search
CPC ........... H01L 25/0657; H01L 29/42392; H01L 29/1054; H01L 29/0847; H01L 29/775;
(Continued)

(56) References Cited

U.S. PATENT DOCUMENTS 7,518,195 B2   4/2009   Ernst et al.
9,064,944 B2   6/2015   Kim et al.
(Continued)

*Primary Examiner* — David Vu
(74) *Attorney, Agent, or Firm* — Birch, Stewart, Kolasch & Birch, LLP

(57) ABSTRACT

A method includes forming a stacked structure of a plurality of first semiconductor layers and a plurality of second semiconductor layers alternately stacked in a first direction over a substrate, the first semiconductor layers being thicker than the second semiconductor layers. The method also includes patterning the stacked structure into a first fin structure and a second fin structure extending along a second direction substantially perpendicular to the first direction. The method further includes removing the first semiconductor layers of the first fin structure to form a plurality of nanowires. Each of the nanowires has a first height, there is a distance between two adjacent nanowires along the vertical direction, and the distance is greater than the first height. The method includes forming a first gate structure between the second semiconductor layers of the first fin structure.

20 Claims, 33 Drawing Sheets

Y1-Y1'

Y2-Y2'

(51) Int. Cl.

| | | |
|---|---|---|
| *H01L 29/10* | (2006.01) | |
| *H01L 29/775* | (2006.01) | |
| *H01L 29/786* | (2006.01) | |
| *H01L 21/8238* | (2006.01) | |
| *H01L 27/092* | (2006.01) | |
| *H01L 25/065* | (2006.01) | |
| *H01L 21/02* | (2006.01) | |
| *H01L 25/04* | (2014.01) | |
| *H01L 29/08* | (2006.01) | |
| *H01L 29/06* | (2006.01) | |
| *H01L 27/06* | (2006.01) | |
| *H01L 29/40* | (2006.01) | |
| *H01L 29/78* | (2006.01) | |
| *B82Y 99/00* | (2011.01) | |
| *B82Y 10/00* | (2011.01) | |

(52) U.S. Cl.
CPC ........ *H01L 25/043* (2013.01); *H01L 27/0617* (2013.01); *H01L 27/092* (2013.01); *H01L 29/0673* (2013.01); *H01L 29/0847* (2013.01); *H01L 29/1054* (2013.01); *H01L 29/401* (2013.01); *H01L 29/42376* (2013.01); *H01L 29/42392* (2013.01); *H01L 29/66* (2013.01); *H01L 29/66439* (2013.01); *H01L 29/775* (2013.01); *H01L 29/7853* (2013.01); *H01L 29/78696* (2013.01); *B82Y 10/00* (2013.01); *B82Y 99/00* (2013.01); *H01L 21/823814* (2013.01)

(58) Field of Classification Search
CPC ......... H01L 29/66439; H01L 29/78696; H01L 29/66; H01L 29/0673; H01L 29/42376; H01L 27/0617; H01L 29/401; H01L 27/092; H01L 29/7853; H01L 21/823807; H01L 21/02008; H01L 25/043; H01L 21/823814; H01L 25/04
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,391,176 B2 | 7/2016 | Flachowsky et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2004/0227181 A1 | 11/2004 | Yeo et al. |
| 2006/0076625 A1 | 4/2006 | Lee et al. |
| 2014/0151639 A1* | 6/2014 | Chang ................ H01L 27/1211 257/27 |
| 2015/0069327 A1* | 3/2015 | Cheng ............ H01L 21/823431 257/19 |
| 2017/0162271 A1 | 6/2017 | Zhu |

* cited by examiner

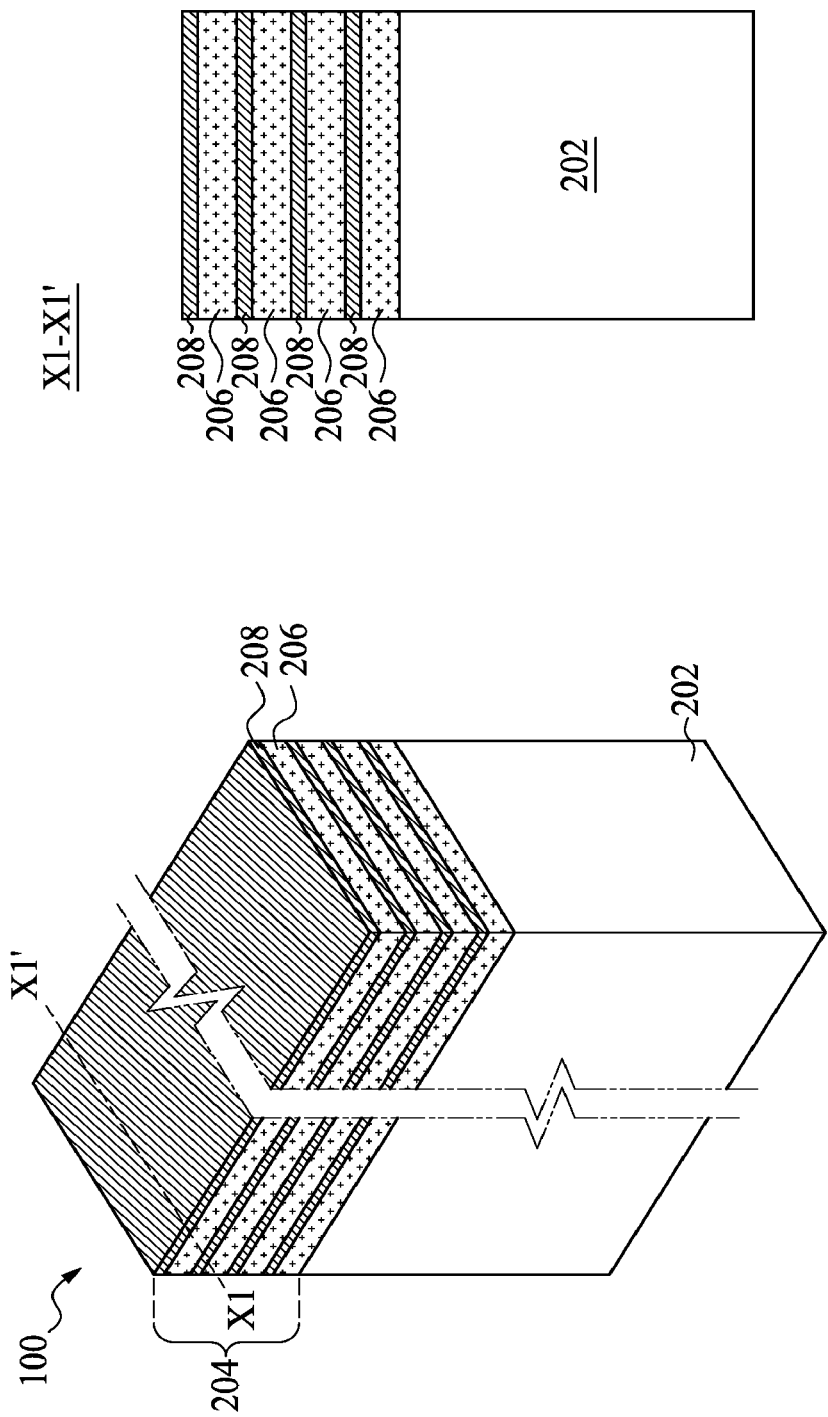

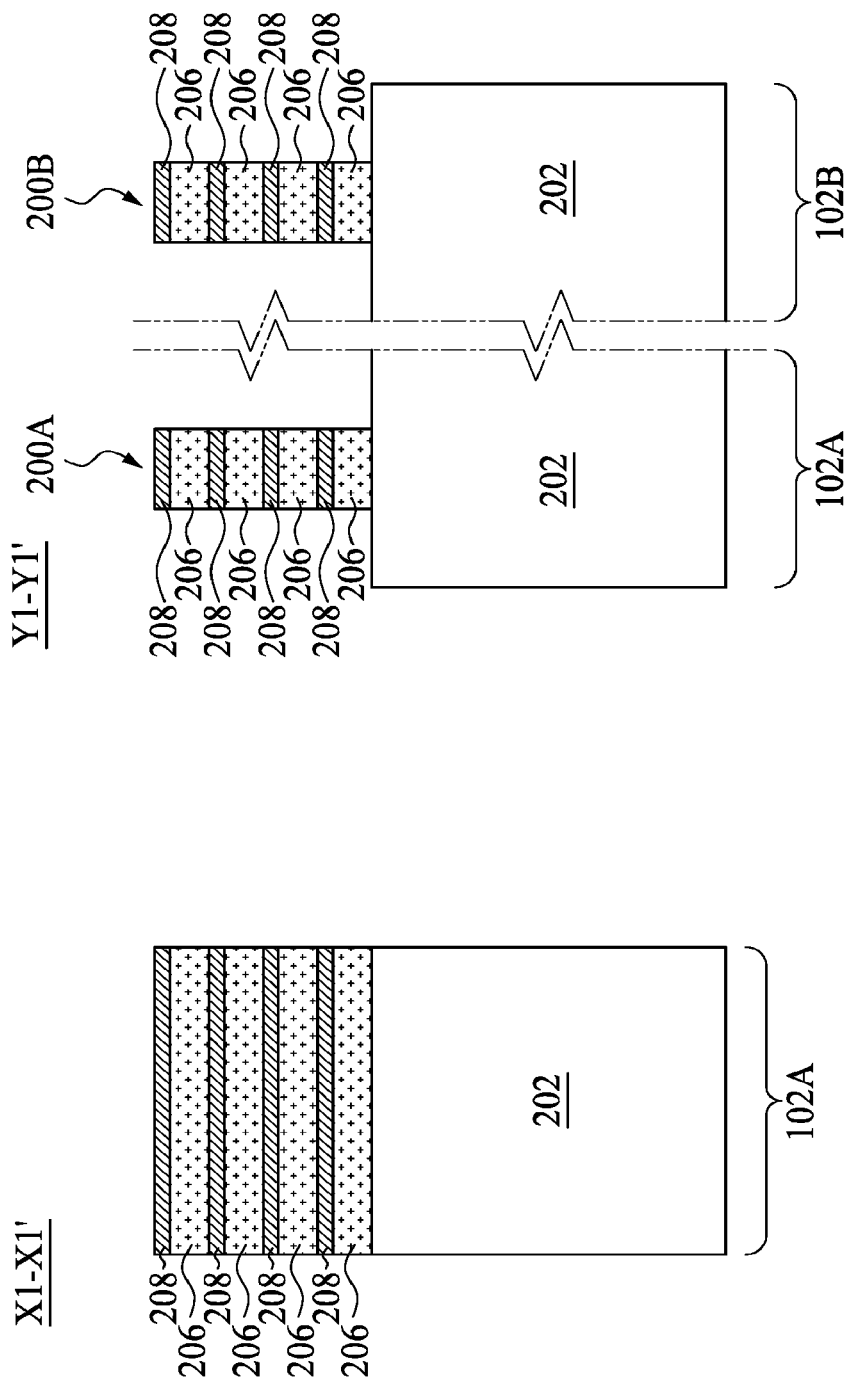

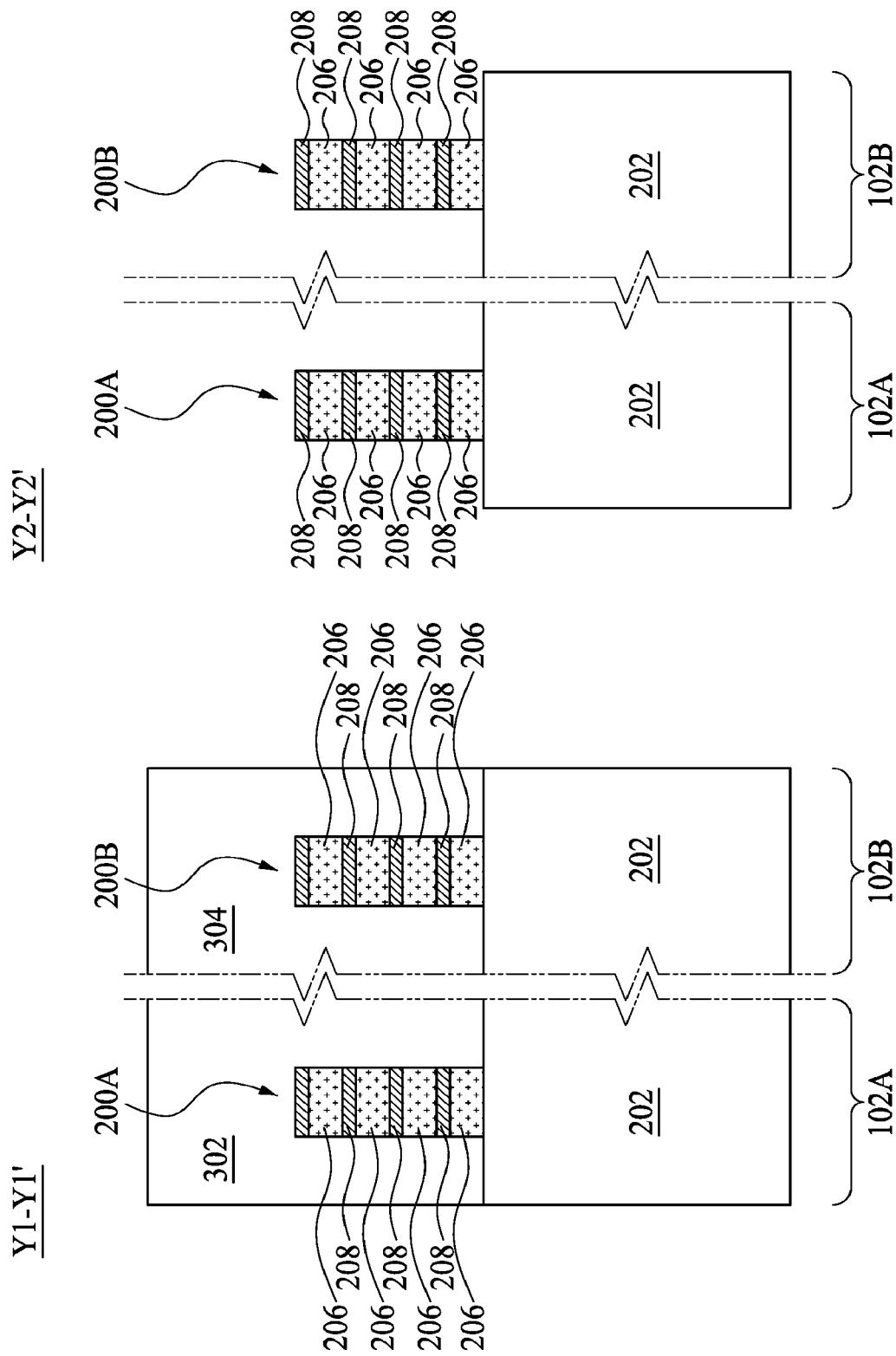

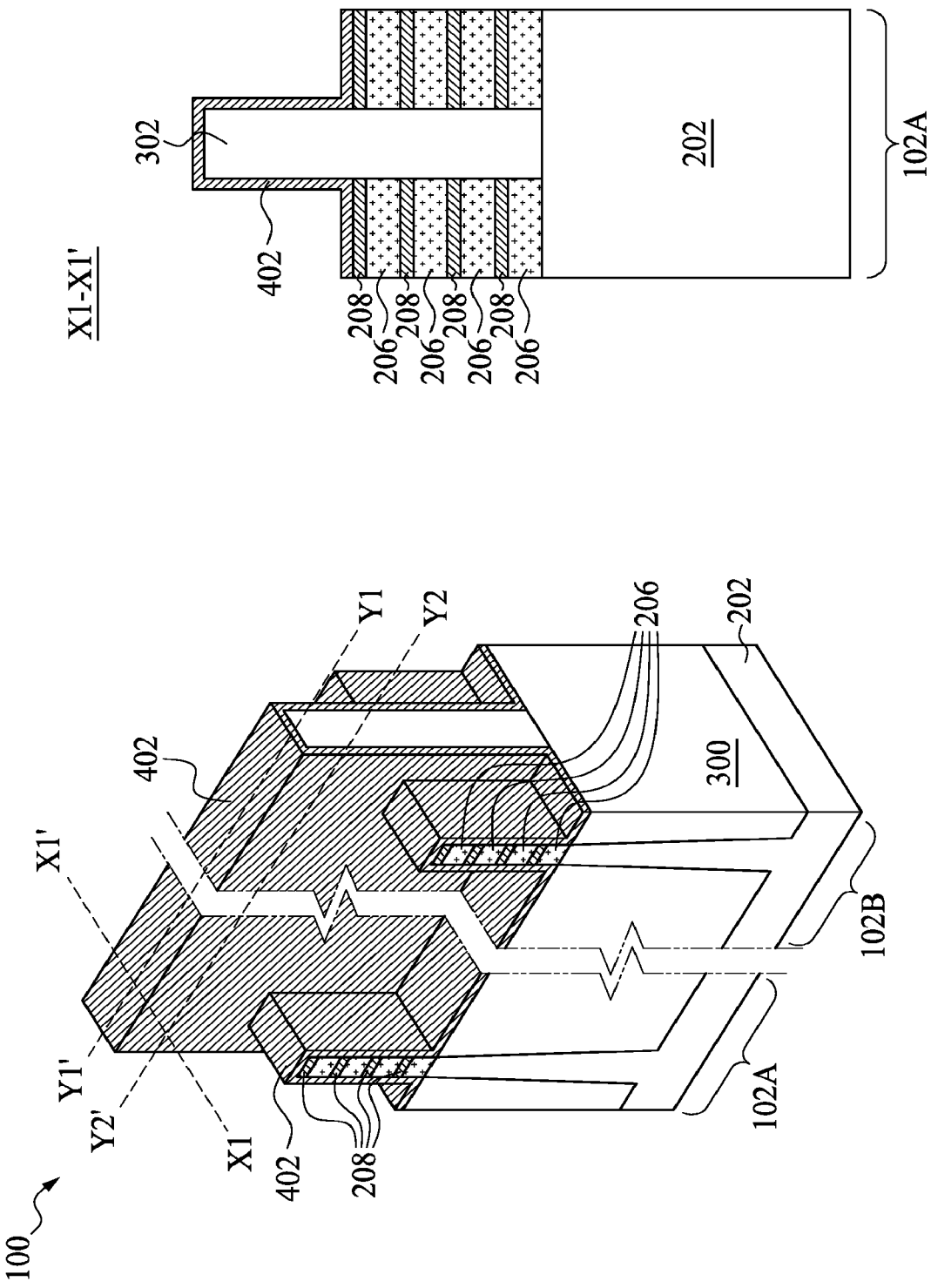

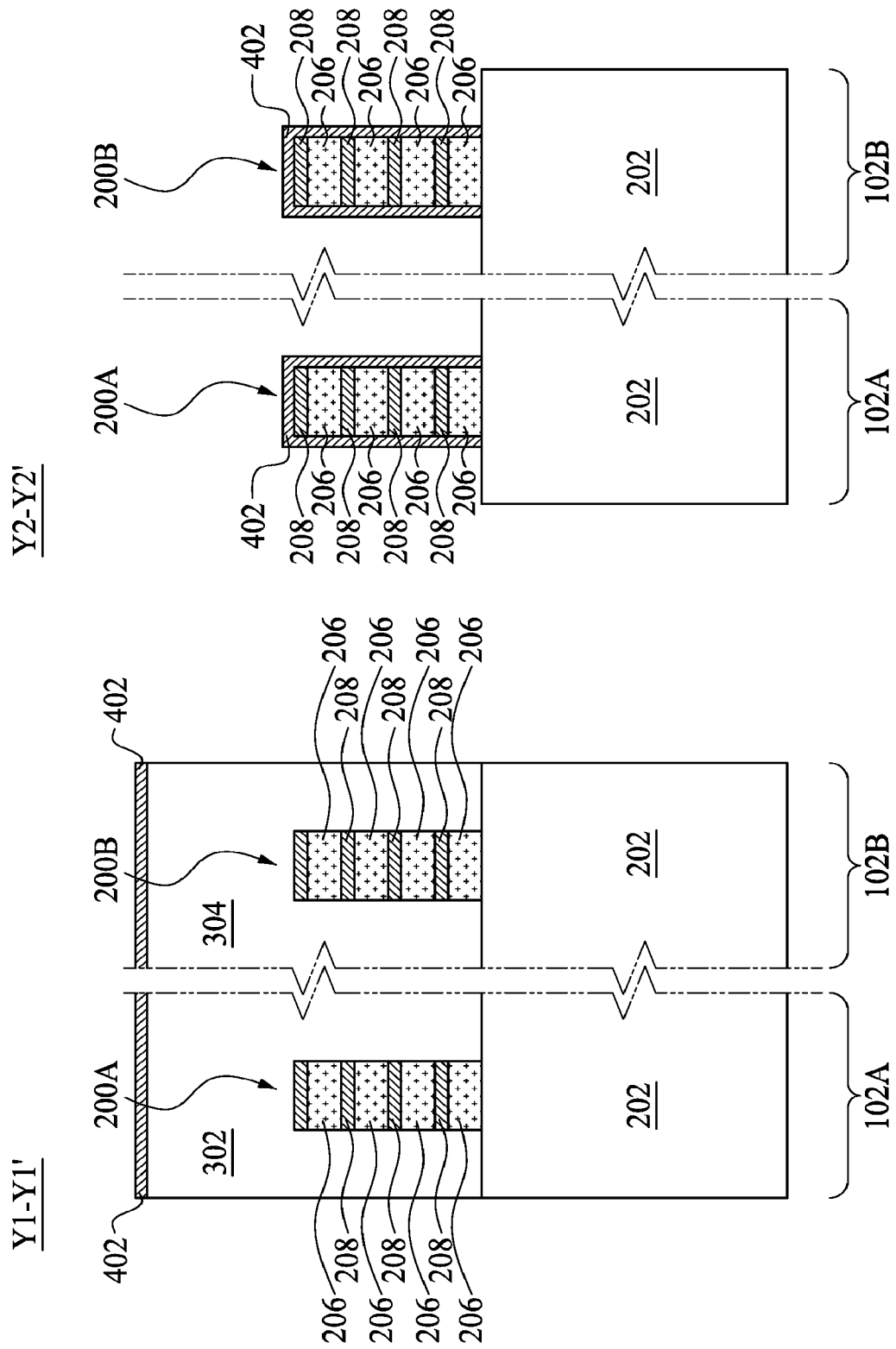

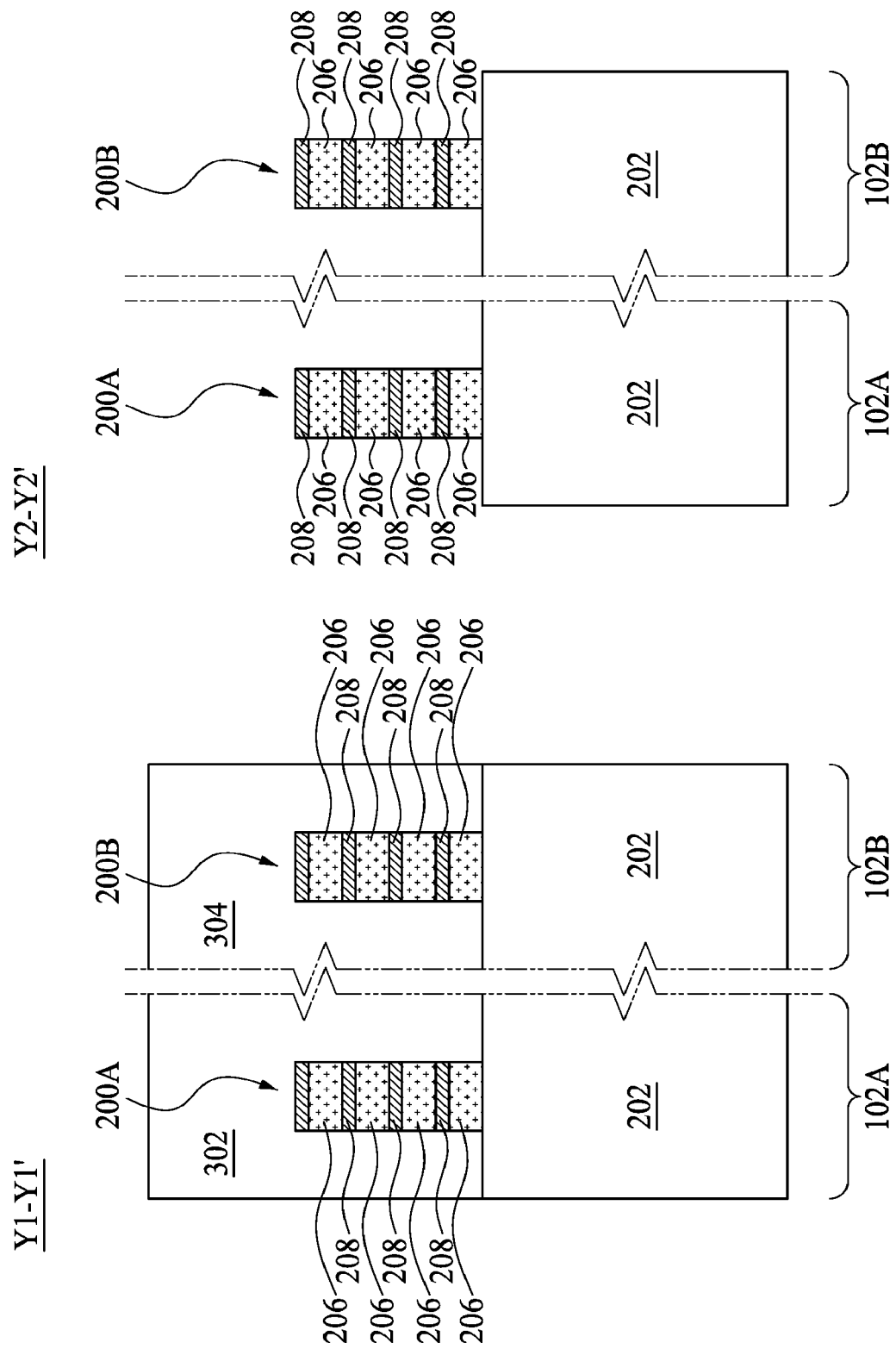

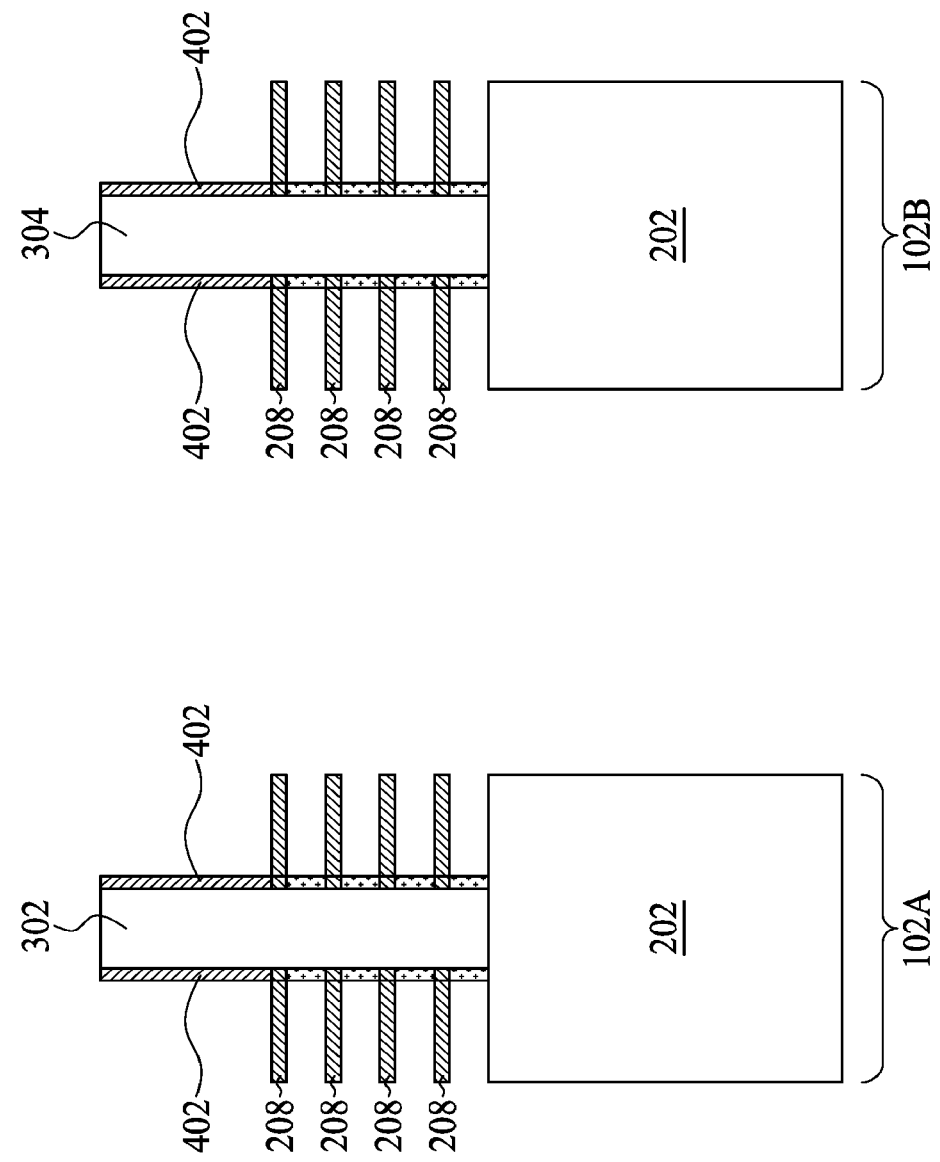

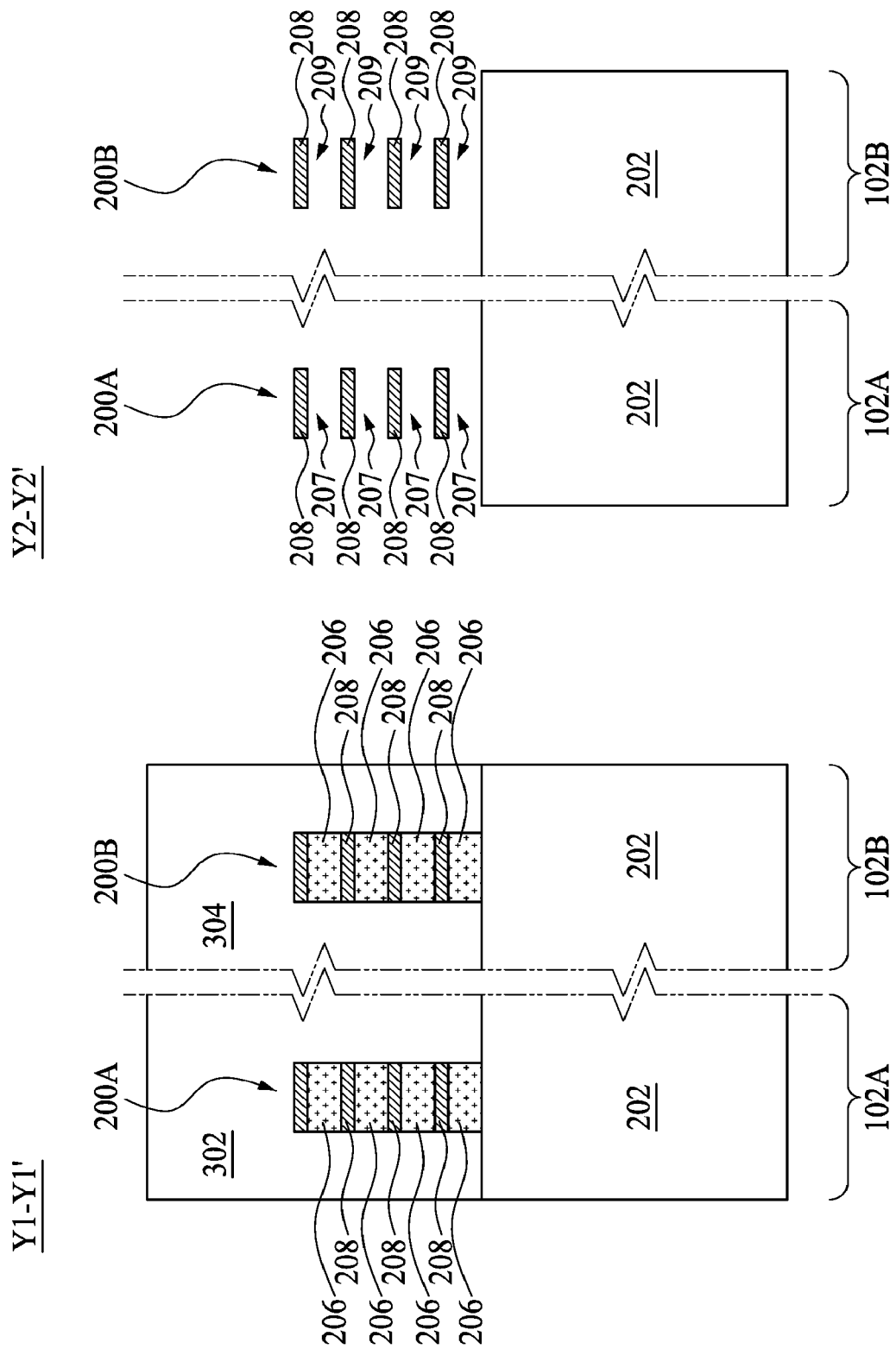

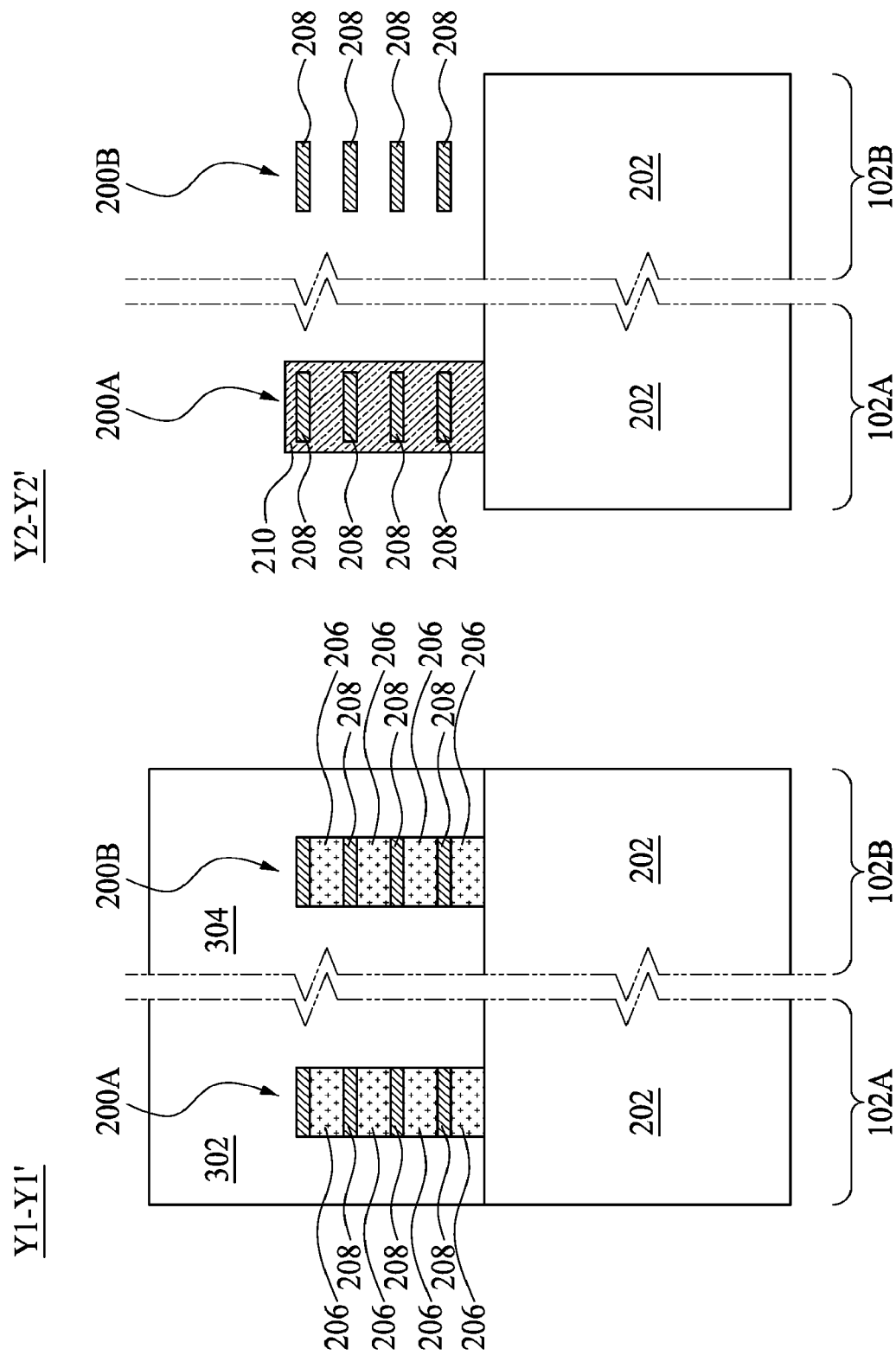

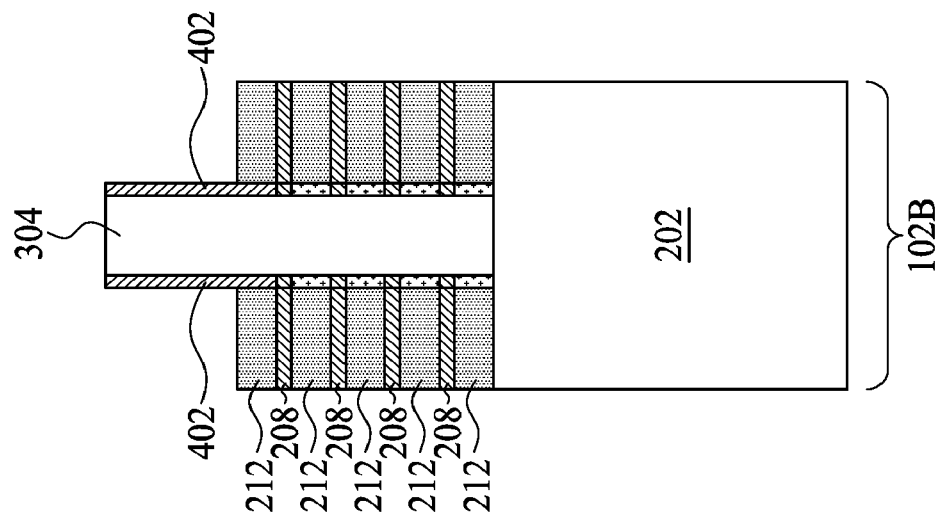
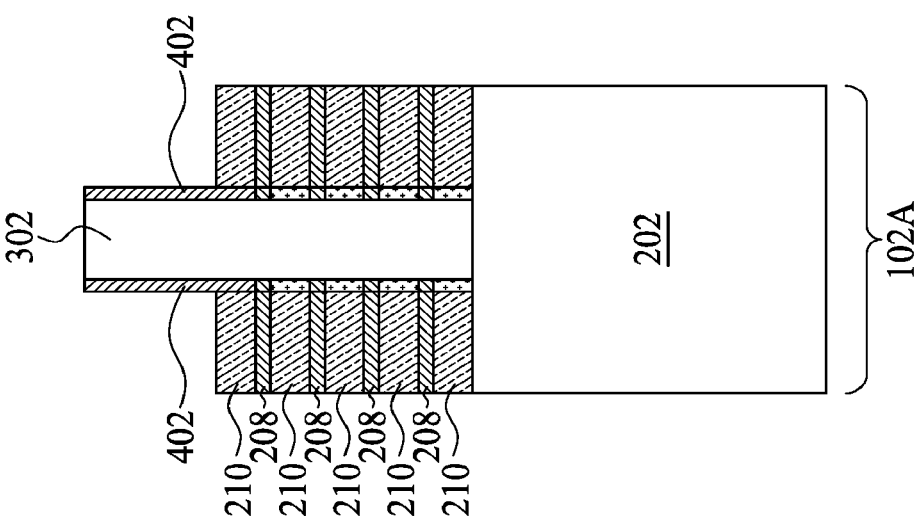

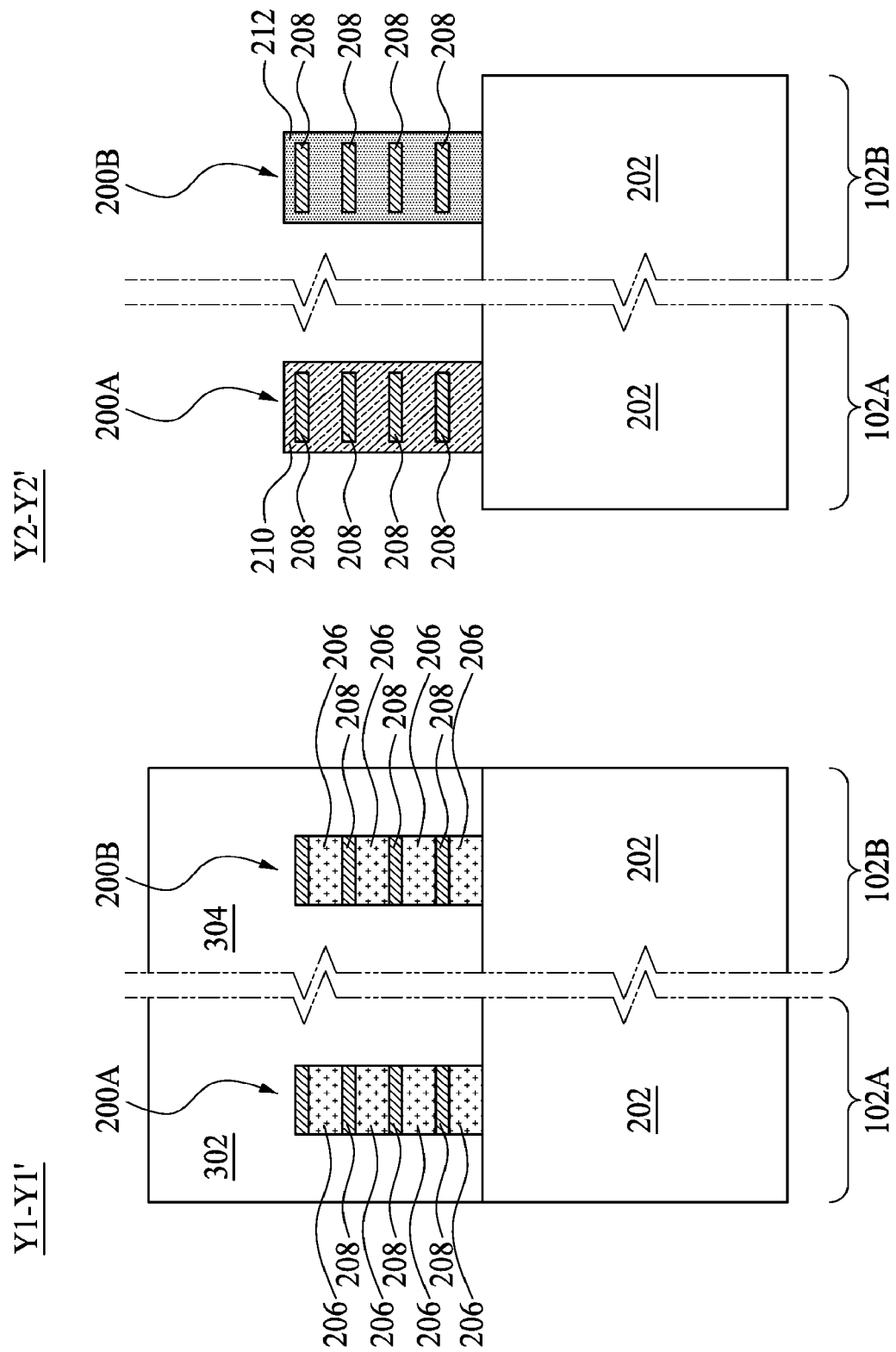

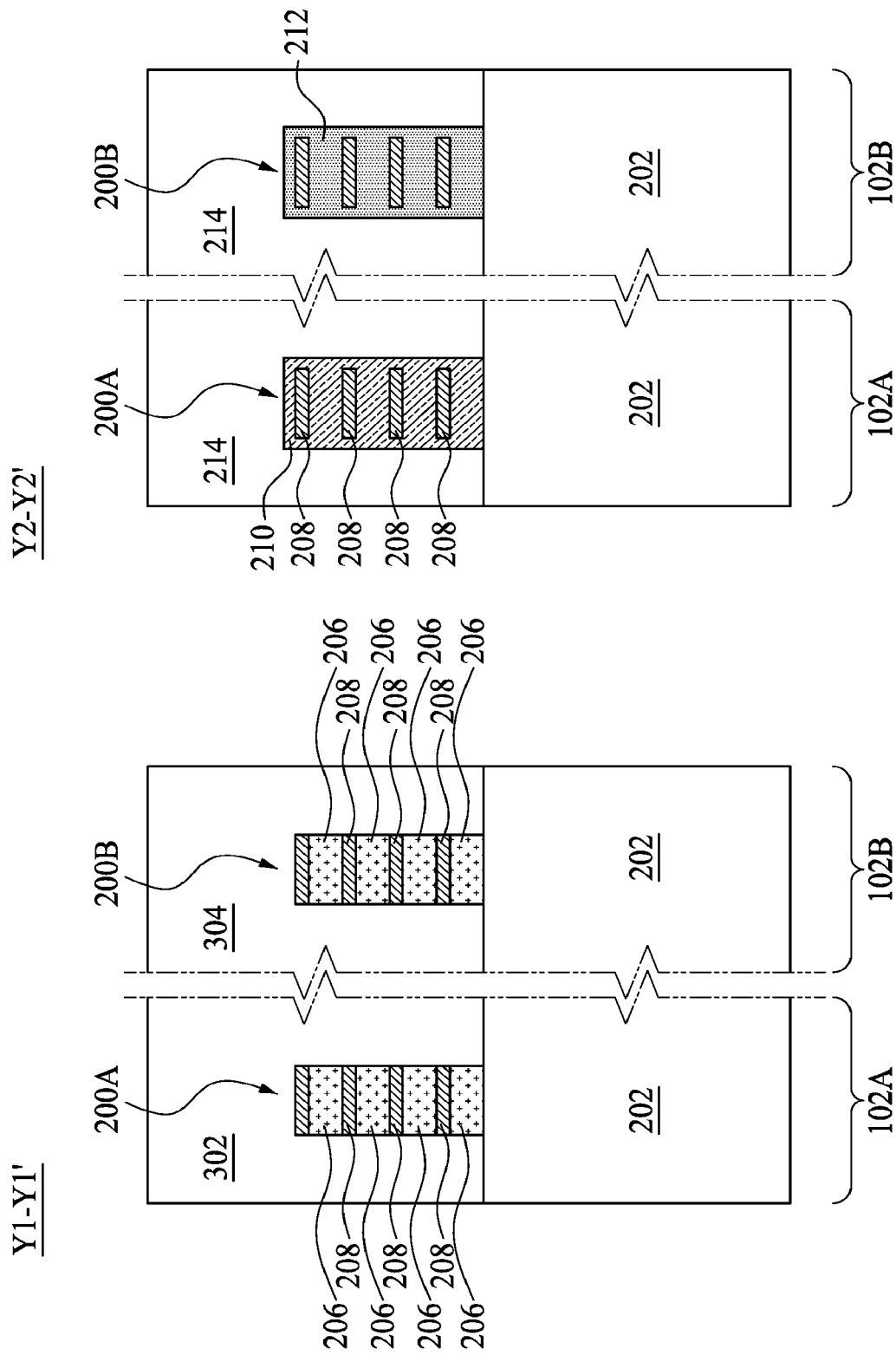

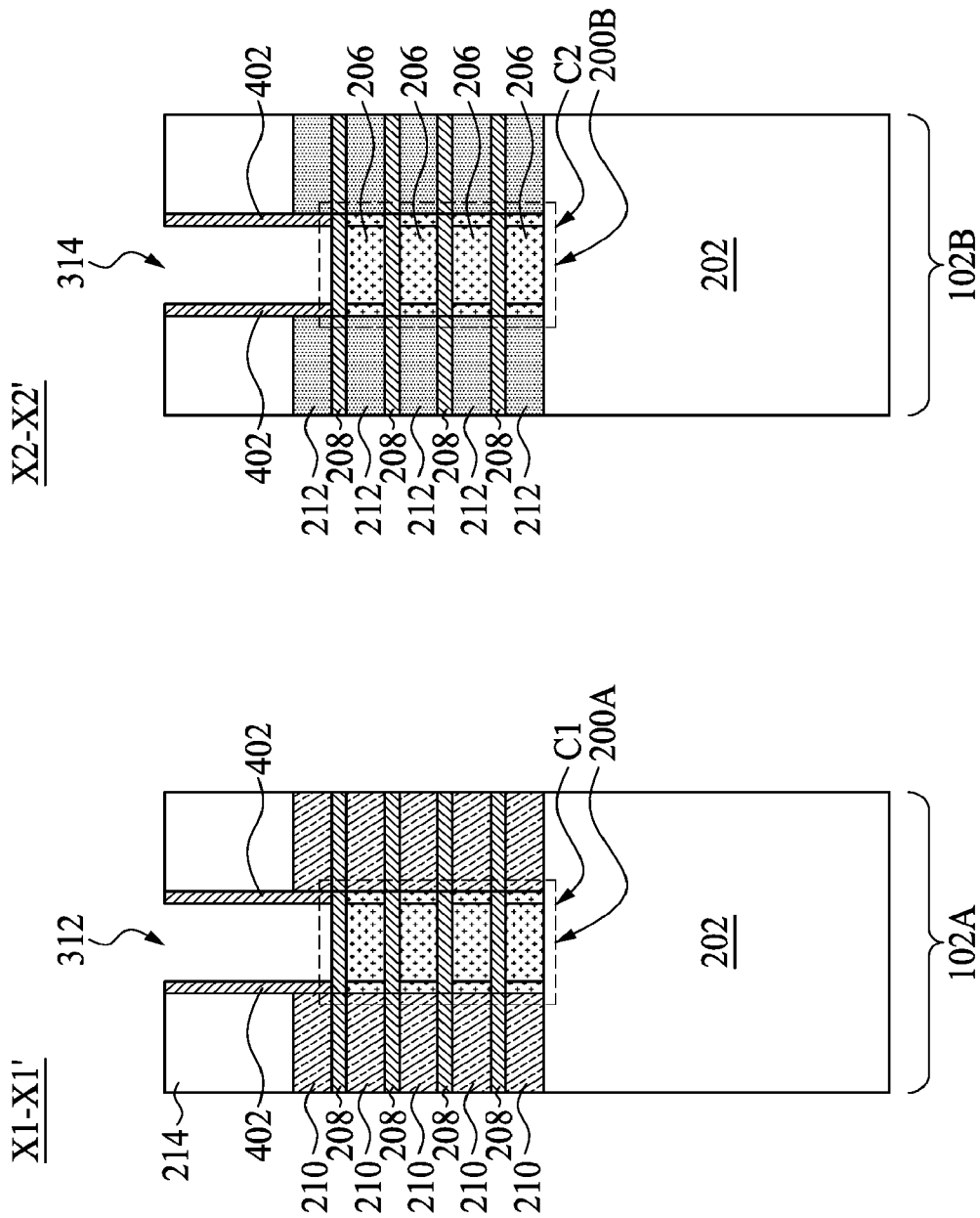

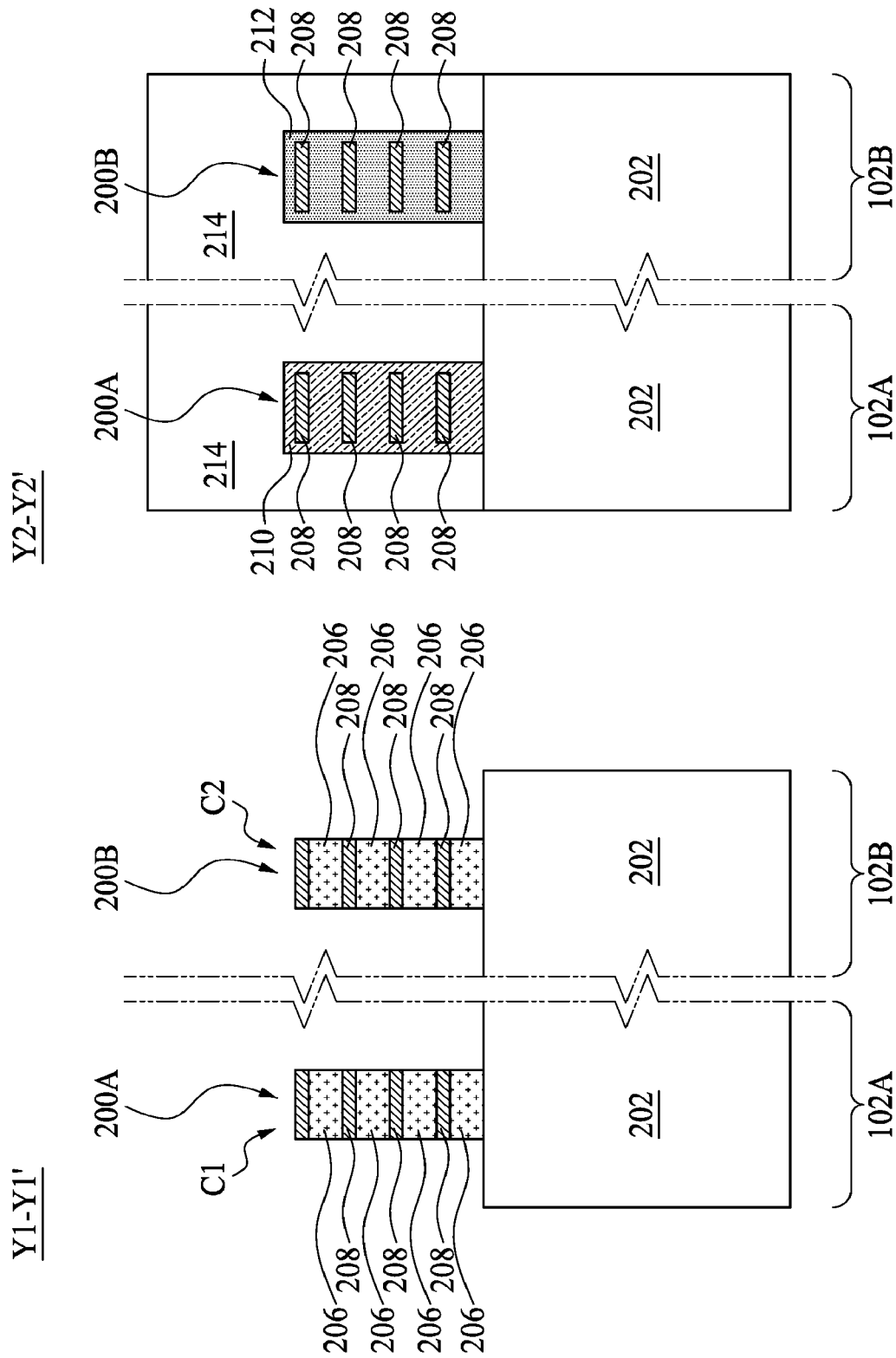

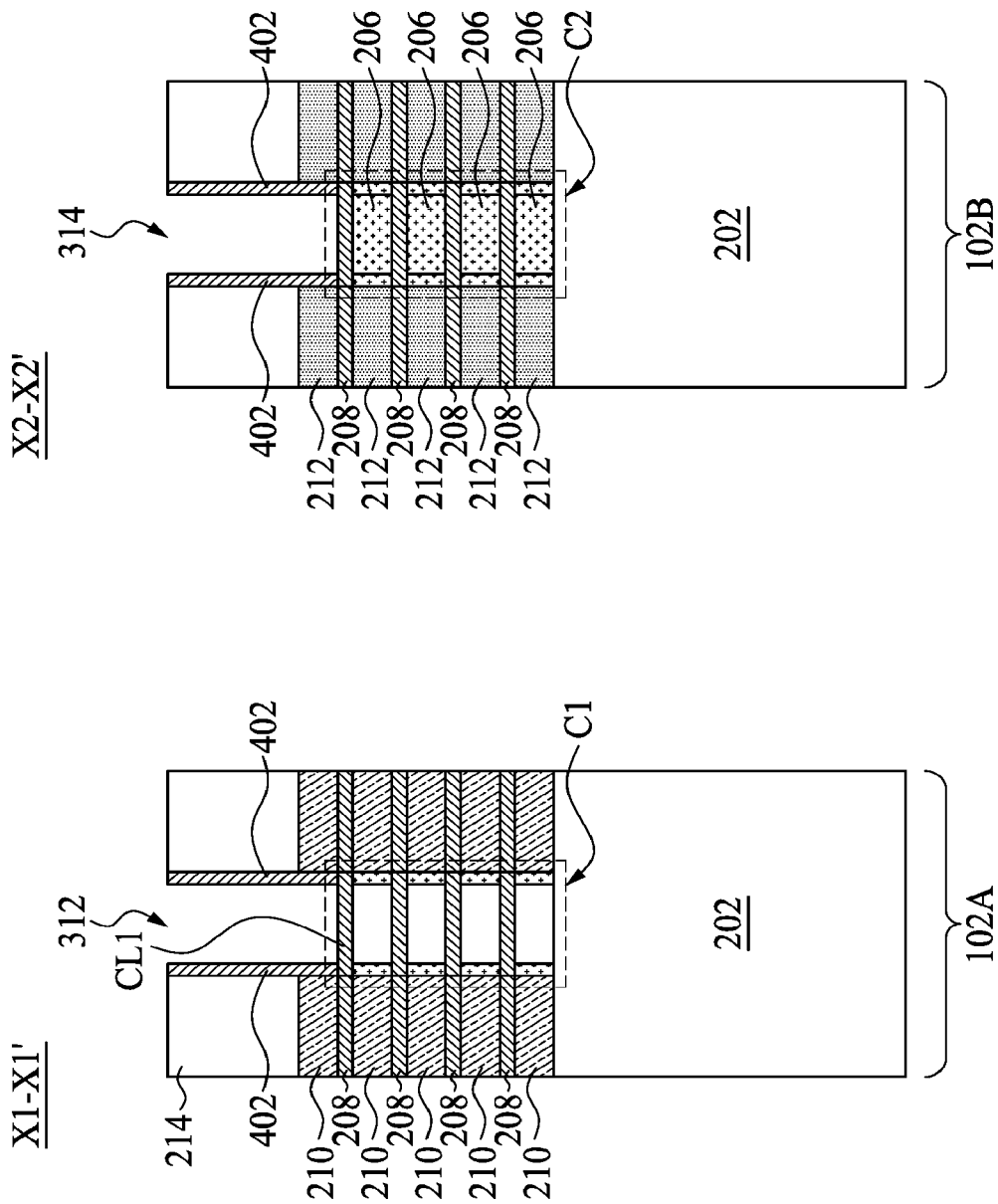

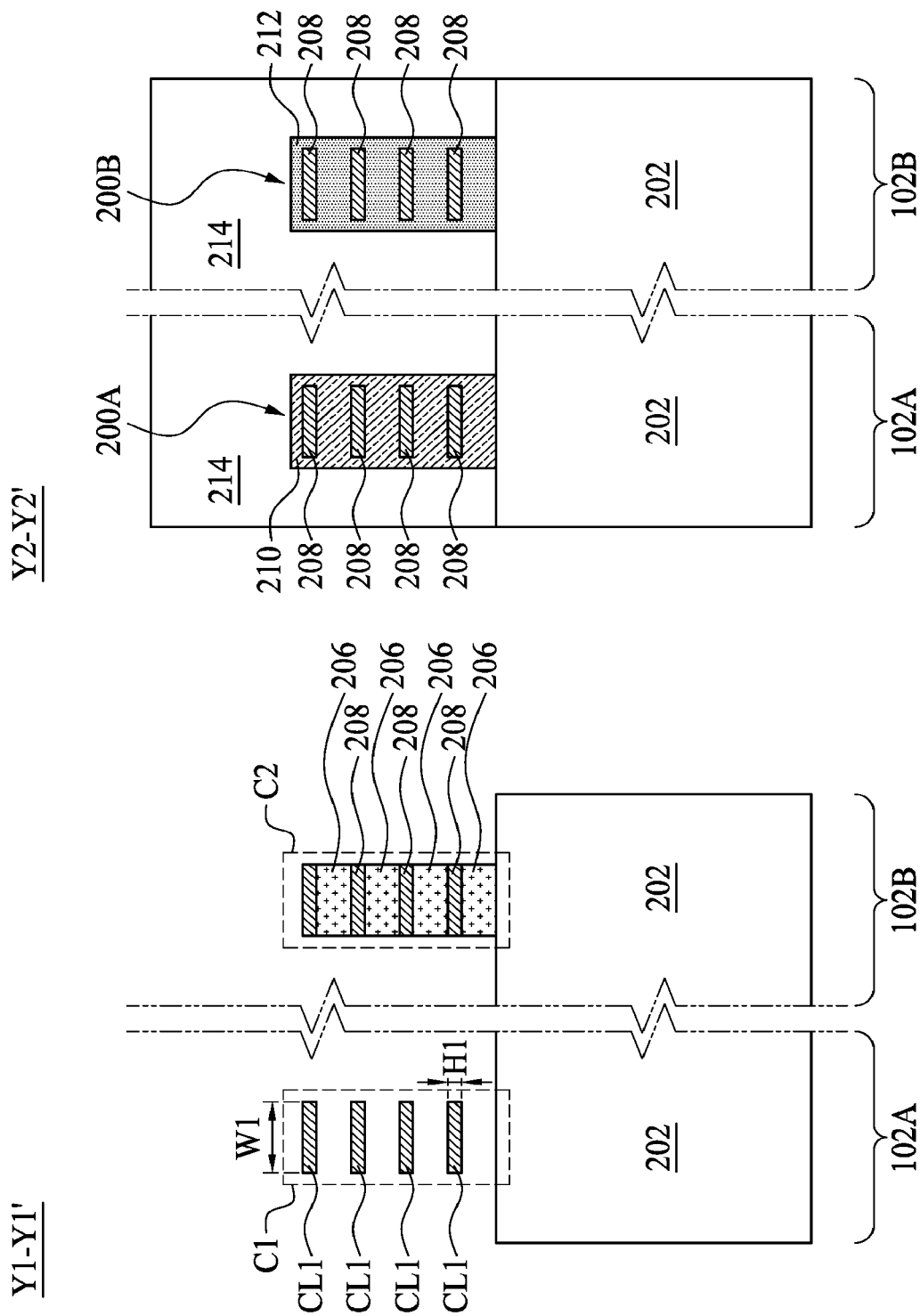

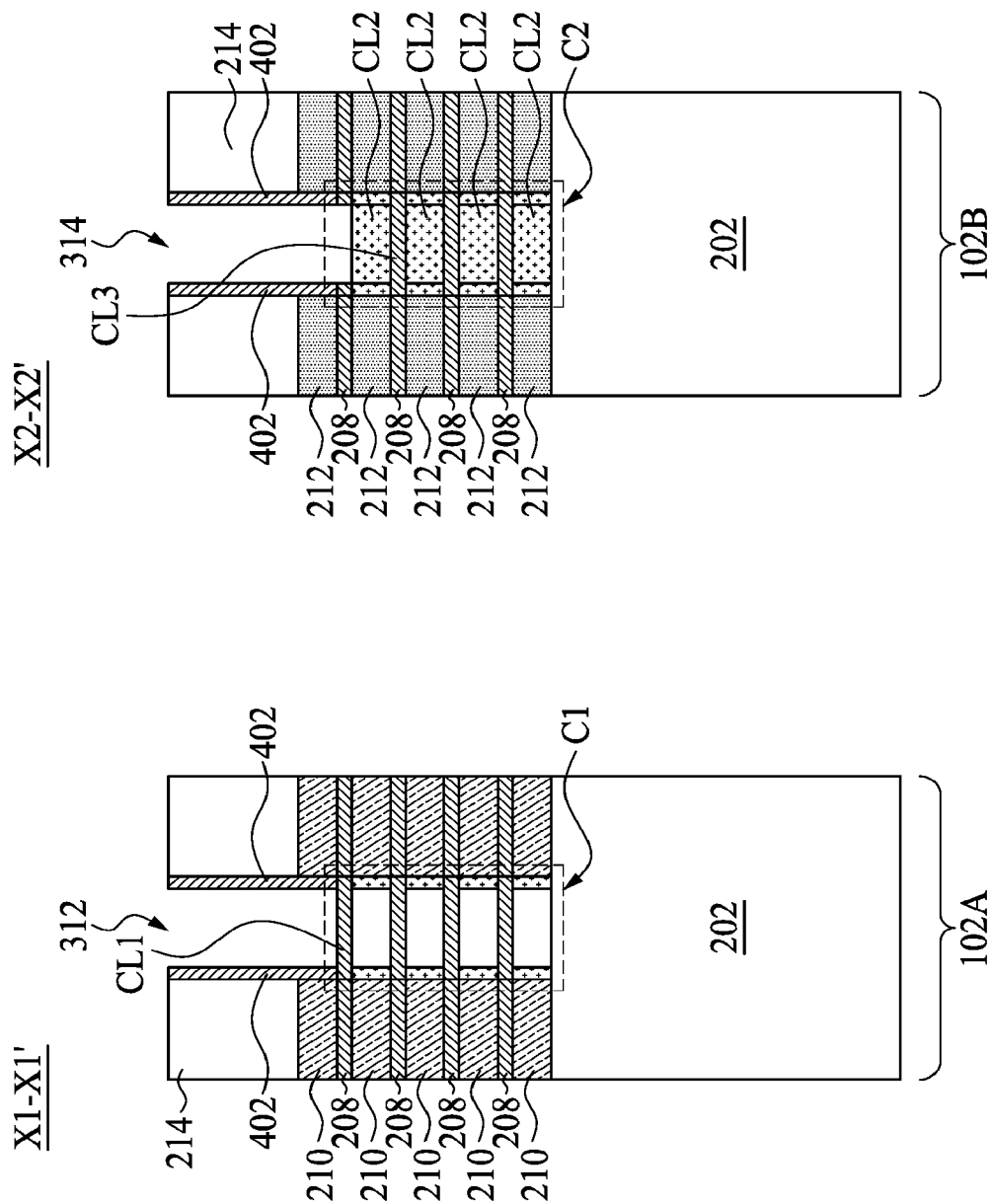

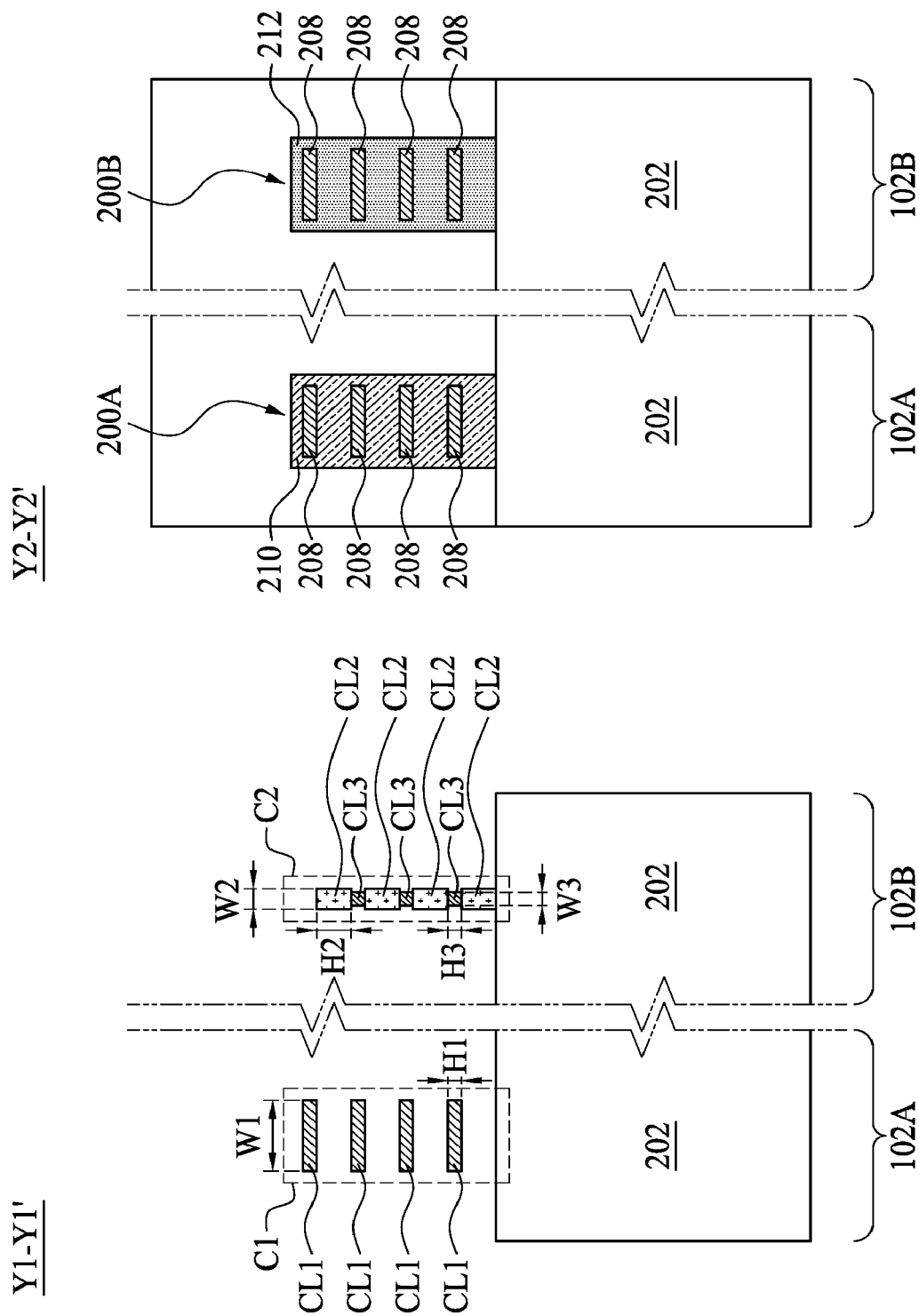

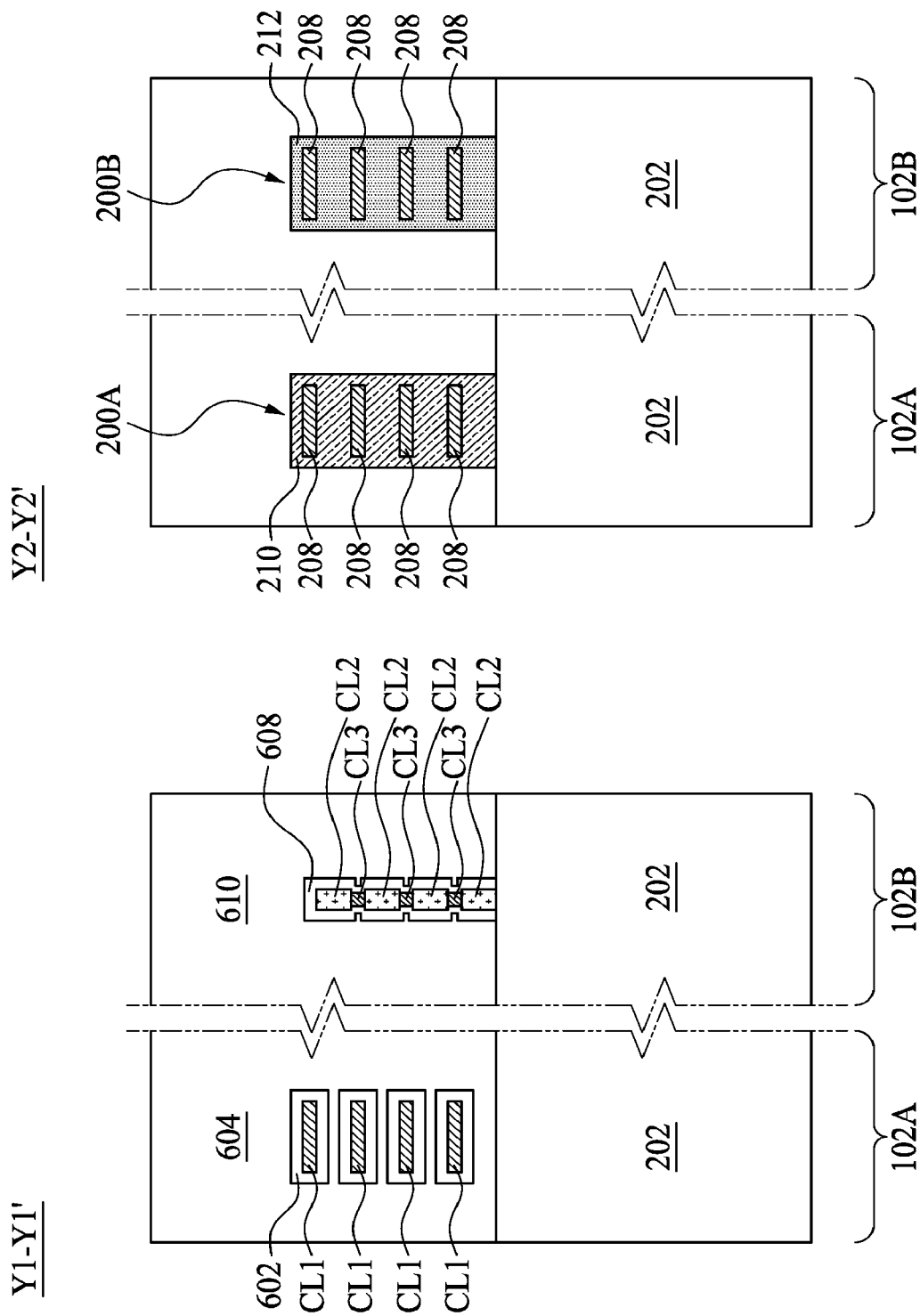

SEMICONDUCTOR DEVICE AND MANUFACTURING METHOD THEREOF

PRIORITY CLAIM AND CROSS-REFERENCE

This application is a Divisional of copending application Ser. No. 15/794,286, filed on Oct. 26, 2017, all of which are hereby expressly incorporated by reference into the present application.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A, 12A and 13A are perspective views of a portion of a semiconductor device in an intermediate stage of fabrication in accordance with some embodiments of the present disclosure.

FIGS. 1B, 2B, 3B, 4B, 5B, 6B, 7B, 8B, 9B, 10B, 11B, 12B and 13B are cross-sectional views of a portion of the semiconductor device in FIG. 1, along the "X1-X1'" line of FIG. 1, in accordance with some embodiments.

FIGS. 2C, 3C, 4C, 5C, 6D, 7D, 8D, 9D, 10D, 11D, 12D and 13D are cross-sectional views of a portion of the semiconductor device in FIG. 1, along the "Y1-Y1'" line of FIG. 1, in accordance with some embodiments.

FIGS. 6C, 7C, 8C, 9C, 10C, 11C, 12C and 13C are cross-sectional views of a portion of the semiconductor device in FIG. 1, along the "X2-X2'" line of FIG. 1, in accordance with some embodiments.

FIGS. 3D, 4D, 5D, 6E, 7E, 8E, 9E, 10E, 11E, 12E and 13E are cross-sectional views of a portion of the semiconductor device in FIG. 1, along the "Y2-Y2'" line of FIG. 1, in accordance with some embodiments.

DETAILED DESCRIPTION

Figure 2A:
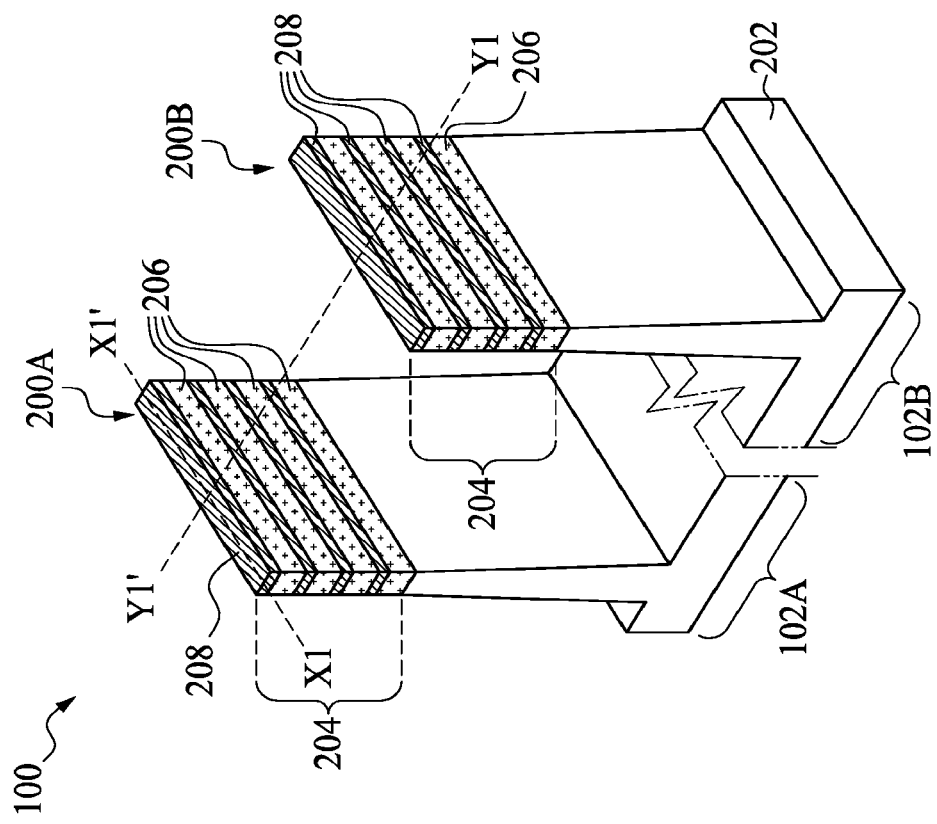
Figure 3B:
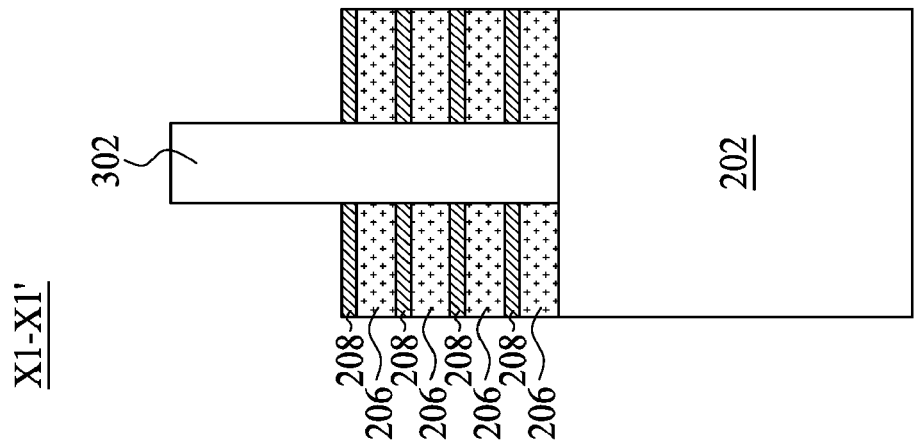
Figure 3A:
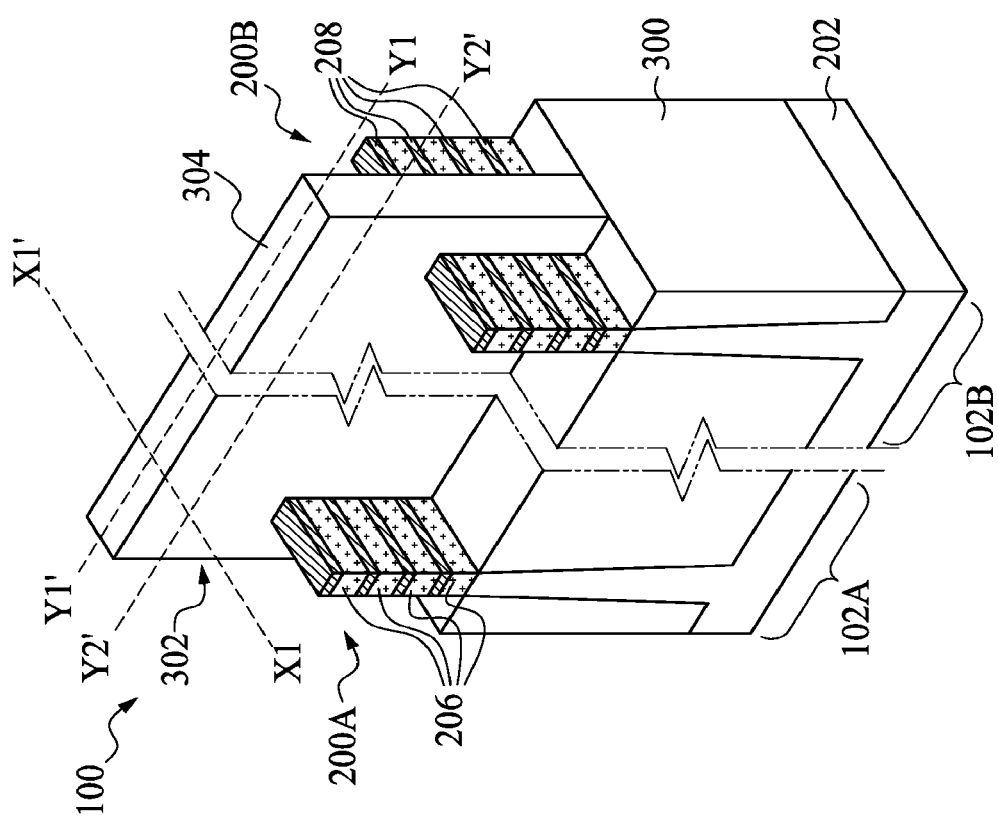
Figure 5B:
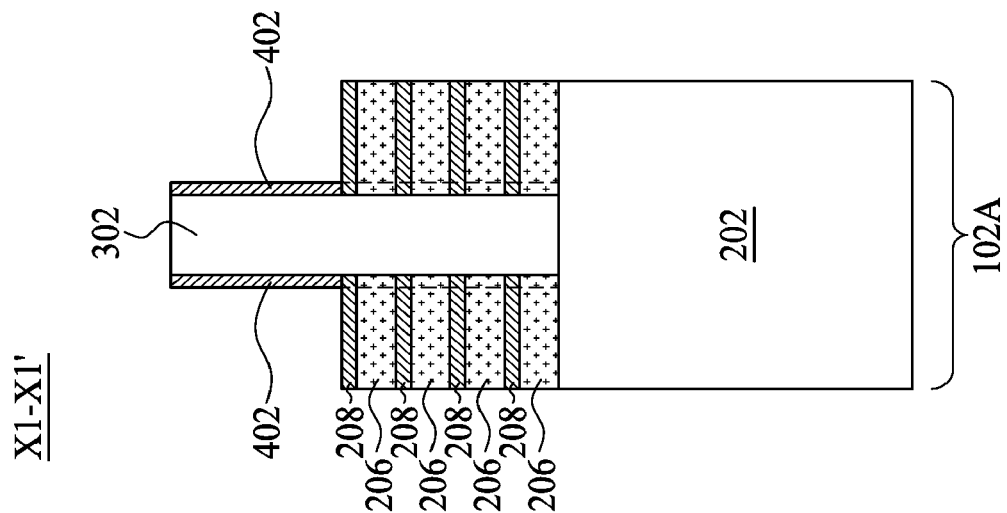
Figure 5A:
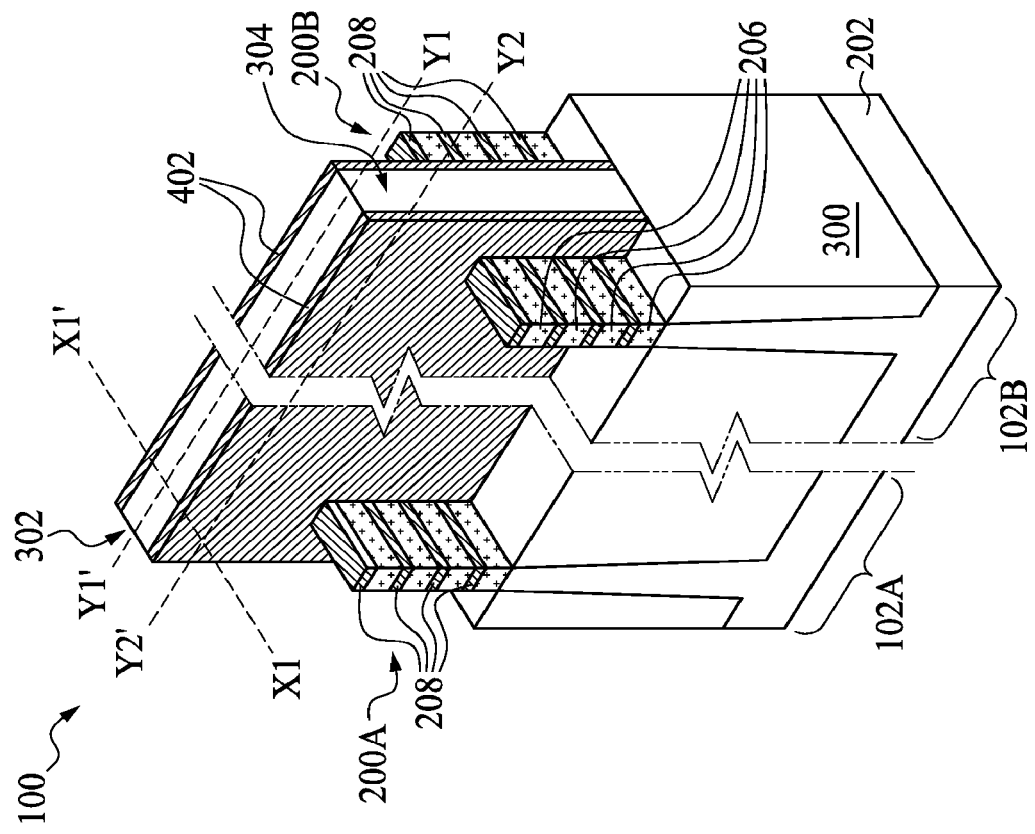

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A through 13E illustrate intermediate stages in the formation of a stacked fin structure. Each of the figure numbers in FIGS. 1A through 13E may include letters "A," "B," "C," "D," or "E," wherein letter "A" indicates that the respective figure illustrates a perspective view, and letters "B," "C," "D," and "E" indicate that the respective figure is obtained from the plane same as the vertical plane containing either line X1-X1', X2-X2', Y1-Y1' or Y2-Y2' in the corresponding perspective view, which will be discussed in detail in subsequent paragraphs.

As shown in FIGS. 1A and 1B, a device 100 is provided. The device 100 includes a substrate 202 which may be a semiconductor substrate, such as a bulk semiconductor, a semiconductor-on-insulator (SOI) substrate, or the like, which may be doped (e.g., with a p-type or an n-type dopant) or undoped. The substrate 202 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, an anti-punch through (APT) implant is performed. For example, the APT implant may be performed in a region underlying the channel region of a device to prevent punch-through or undesired diffusion.

Referring again to FIG. 1A. A semiconductor stack 204 is epitaxially grown over the substrate 202. The semiconductor stack 204 includes a plurality of first semiconductor layers 206 and a plurality of second semiconductor layers 208 disposed in an alternating manner. The first semiconductor layer 206 includes a first composition and the second semiconductor layer 208 includes a second composition. The first and second compositions have different oxidation rates and/or etch selectivity. In some embodiments, the first semiconductor layer 206 is SiGe, and the second semiconductor layer 208 is Si. To further these embodiments, the SiGe layer 206 may be undoped or substantially dopant-free (i.e., having an extrinsic dopant concentration from about 0 $cm^{-3}$ to about $1 \times 10^{17}$ $cm^{-3}$), where for example, no intentional doping is performed when forming the Si layer 208. Alternatively, the Si layer 208 may be intentionally doped. For example, the Si layer 208 may be doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel. Furthermore, the SiGe layer 206 may include more than 20% Ge in molar ratio. For example, germanium atomic percentage in the SiGe layer 206 may be from about 20% to about 100%. Furthermore, the first semiconductor layers 206 may include different compositions among them, and the second semiconductor layers 208 may include different compositions among them. The second semiconductor layer 208 may include the same material as the substrate 202 in some embodiments. In other embodiments, the second semiconductor layer 208 includes a material different from that of the substrate 202. The materials of the first and second semiconductor layers 206 and 208 may be chosen based on providing different etch selectivity properties. Alternatively, in some embodiments, either of the first and second semiconductor layers may include other materials such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the first and second semiconductor layers 206 and 208 are substantially dopant-free. That is, no intentional doping is performed in the semiconductor stack 204 during the epitaxial growth.

It is noted that four layers of each of the first and second semiconductor layers 206 and 208 are illustrated in FIGS. 1A and 1B, and these are, of course, merely examples and are not intended to be limiting. Depending on the desired number of channel regions for the device 100, an additional number of semiconductor layers can be formed in the semiconductor stack 204. In some embodiments, the number of the first semiconductor layers 206 ranges from 2 to 10. In some embodiments, the first semiconductor layer 206 is a bottommost layer of the semiconductor stack 204, and the second semiconductor layer 208 is the uppermost layer of the semiconductor stack 204. However, any other suitable arrangement of the first and second semiconductor layers may alternatively be utilized.

In some embodiments, the first semiconductor layer 206 has a thickness greater than a thickness of the second semiconductor layer 208. As described in more detail below, portions of the first and second semiconductor layers 206 and 208 remain after a series of processes and serve as channel regions for subsequently formed multi-gate devices. The thickness difference is advantageous for forming N-type and P-type devices having respective channels with improved geometry, as further discussed below. The epitaxial growth of the layers of the semiconductor stack 204 may be performed using, for example, molecular beam epitaxy (MBE), metal-organic chemical vapor deposition (MOCVD), and/or other suitable epitaxial growth processes.

The semiconductor stack 204 is patterned to form a first fin 200A and a second fin 200B, extending from the substrate 202. The resulting structure is shown in FIGS. 2A, 2B and 2C. In some embodiments, the first and second fins 200A and 200B include portions of the substrate 202 and portions of the semiconductor stack 204, respectively. The first fin 200A is in a first FET (field effect transistor) region 102A in the device 100, and the second fin 200B is in a second FET region 102B in the device 100. In some embodiments, the substrate 202 may include isolation features to isolate the first and second FET regions 102A and 102B.

An isolation layer 300 is formed over the substrate 202 so that the first and second fins 200A and 200B are embedded in the isolation layer 300. The isolation layer 300 is subsequently planarized by a suitable planarization, for example, a chemical mechanical planarization (CMP) method to expose upper surfaces of the first and second fins 200A and 200B. Subsequently, the isolation layer 300 is recessed using suitable anisotropic etching technique to partially expose the first and second fins 200A and 200B. The resulting structure is shown in FIGS. 3A, 3B, 3C and 3D.

Then, a first dummy gate stack 302 and a second dummy stack 304 are formed over the substrate 202. In particular, the first and second dummy gate stacks 302 and 304 wrap around central portions of the first and second fins 200A and 200B, respectively. In some embodiments, the first and second dummy gate stacks 302 and 304 include a dummy gate dielectric layer and a dummy gate electrode layer. In some embodiments, the dummy gate dielectric layer is made of high-k dielectric material, such as metal oxide, metal nitride, metal silicate, transition metal-oxide, transition metal-nitride, transition metal-silicates, oxynitride of metal, the like, or combinations thereof. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, other applicable dielectric materials, or combinations thereof. In some embodiments, the dummy gate electrode layer is made of polysilicon.

The first and second dummy gate stacks 302 and 304 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). The dummy gate stacks serve as a sacrificial gate that will be replaced at later stages of fabrication. In particular, the dummy gate stacks may be replaced by a high-K dielectric layer and a metal gate electrode.

Reference is made to FIGS. 4A, 4B, 4C and 4D. A spacer layer 402 is formed on top surfaces and sidewalls of the first and second dummy gate stacks 302 and 304, and on the first and second fins 200A and 200B. The spacer layer 402 may include a dielectric material such as silicon oxide, silicon nitride (SiN), silicon carbide (SiC), silicon oxynitride (SiON), silicon oxycarbonitride (SiOCN), the like, and/or combinations thereof, for example, formed using any suitable process, such as CVD, subatmospheric CVD (SACVD), flowable CVD, ALD, PVD, or other suitable methods. In some embodiments, the deposition of the spacer layer 402 may be a conformal process. The spacer layer 402 is illustrated as a single layer. However, the present disclosure is not limited thereto. The spacer layer 402 may include a single layer or a multilayer structure. As shown in FIGS. 5A, 5B, 5C and 5D, the spacer layer 402 is etched by an etching back (e.g., anisotropically) process to remove portions of the spacer layer 402 from top surfaces of the first and second dummy gate stacks 302 and 304, and from top surfaces and sidewalls of the first and second fins 200A and 200B. Portions of the spacer layer 402 remain on sidewalls of the first and second dummy gate stacks 302 and 304 and serve as gate spacers 402. Portions of the first and second fins 200A and 200B adjacent to and not covered by the first and second dummy gate stacks 302 and 304 are exposed. In some embodiments, the anisotropic etching process is a dry (e.g., plasma) etching process.

Reference is made to FIGS. 6A, 6B, 6C, 6D and 6E. Exposed portions of the first semiconductor layers 206 are etched to leave gaps 207 between neighboring second semiconductor layers 208 in the first FET region 102A and gaps 209 between neighboring second semiconductor layers 208 in the second FET region 102B. As a result of the etching process, portions of the second semiconductor layers 208 not covered by the dummy gate stacks 302, 304 and the gate spacers 402 remain above the substrate 202, and they can be referred to as source/drain (S/D) layers in the following discussion.

In some embodiments, the first semiconductor layers 206 are etched by a selective wet etching process that selectively removes the first semiconductor layers 206 while the second semiconductor layers 208 remain substantially unetched. In some embodiments, the selective wet etching process may include a hydro fluoride (HF) or NH$_4$OH etchant. In some embodiments where the first semiconductor layers comprise SiGe and the second semiconductor layers comprise Si, the selective removal of the SiGe layers may include a SiGe oxidation process followed by a SiGeO$_x$ removal. For example, the SiGe oxidation process may include forming and patterning various masking layers such that the oxidation is controlled to the SiGe layers. In other embodiments, the SiGe oxidation process is a selective oxidation due to the different compositions of the first and second semiconductor layers. In some examples, the SiGe oxidation process may be performed by exposing the device to a wet oxidation process, a dry oxidation process, or a combination thereof. Thereafter, the oxidized first semiconductor layers, which include SiGeO$_x$, are removed by any suitable etchant such as NH$_4$OH, diluted HF or the like.

Figure 6A:
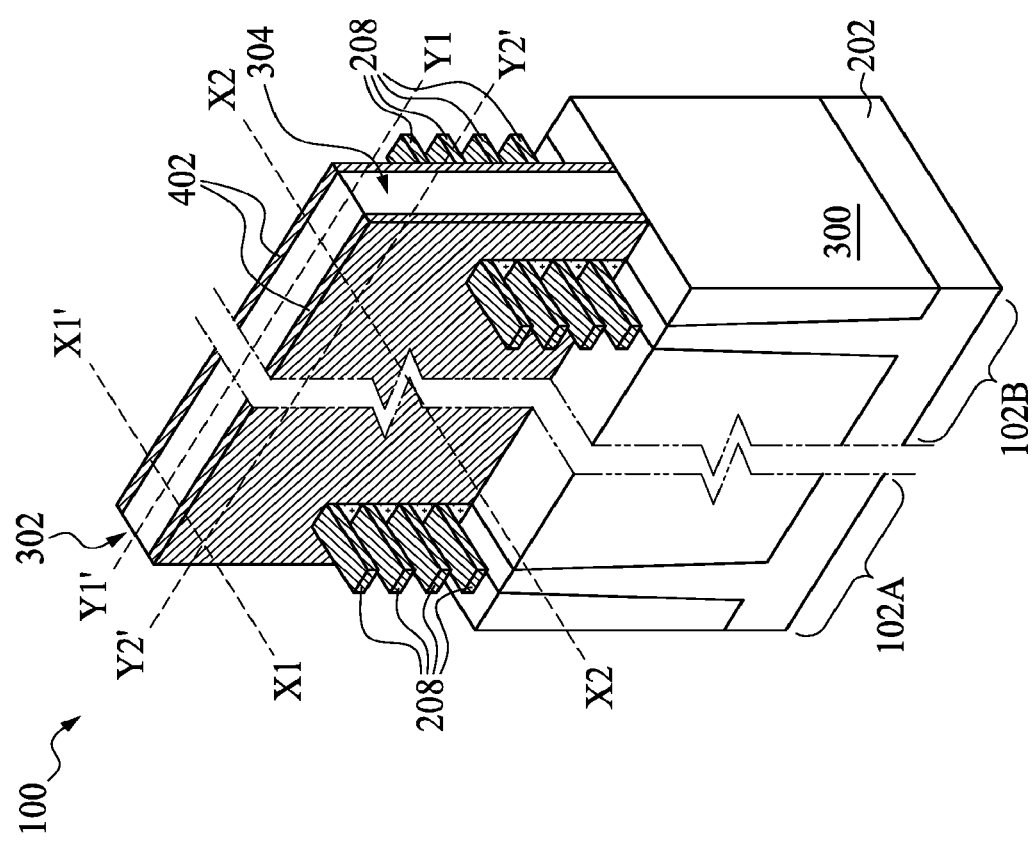

In some embodiments, the first and second semiconductor layers 206 and 208 provide different oxidation rates and/or different etch selectivity, which enables the selective removal of the first semiconductor layers 206. In some embodiments, the second semiconductor layers 208 are slightly etched to obtain S/D layers with suitable geometry. For example, the resultant S/D layers 208 may have a bar-like shape (as shown in FIG. 6A), a rod-like shape (not shown), or other shapes.

Reference is made to FIGS. 7A, 7B, 7C, 7D and 7E. An epitaxy process is carried out to grow a first epitaxial structure 210 from the S/D layers 208 in the first FET region 102A, such that the first epitaxial structure wraps around and is in contact with the S/D layers 208 in the first FET region 102A of the device 100. In some embodiments, the second FET region 102B may be protected by a mask (not shown) during the epitaxy process, so that another epitaxial layer different from the first epitaxial structure 210 can be formed around the S/D layers 208 in the second FET region 102B. In some other embodiments, the second FET region 102B is not masked, so that the S/D layers 208 in the first and second FET regions 102A and 102B are wrapped around by the first epitaxial structure 210.

In some embodiments, the grown semiconductor material of the first epitaxial structure 210 may include Ge, Si, GaAs, AlGaAs, SiGe, GaAsP, SiP, or other suitable material. In some embodiments, the material of the first epitaxial structure 210 may be in-situ doped during the epi process. For example, in some embodiments, epitaxially grown material may be doped with boron. In some embodiments, epitaxially grown material may be doped with carbon to form Si:C source/drain features, phosphorous to form Si:P source/drain features, or carbon and phosphorous to form SiCP source/drain features. In some embodiments, the epitaxial material of the first epitaxial structure 210 is silicon and the layer 208 also is silicon. In some embodiments, the first epitaxial structure 210 and the layers 208 may comprise a similar material (e.g., Si), but be differently doped. In other embodiments, the epitaxy layer for the first epitaxial structure 210 includes a first semiconductor material, the epitaxially grown material 208 includes a second semiconductor different than the first semiconductor material. In some embodiments, the epitaxially grown material of the first epitaxial structure 210 is not in-situ doped, and, for example, instead an implantation process is performed.

In some embodiments, the first epitaxial structure 210 is grown by a molecular beam epitaxy (MBE) process, a chemical vapor deposition process, and/or other suitable epitaxial growth processes.

Figure 7A:
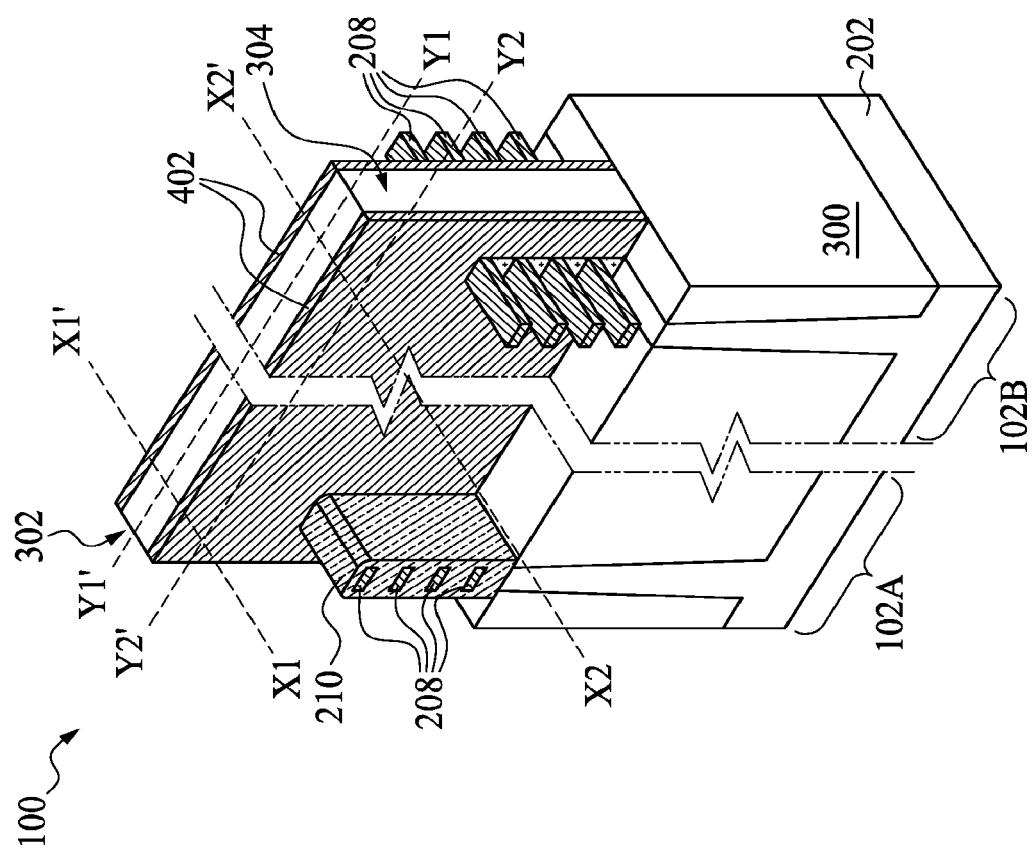
Figure 7C:
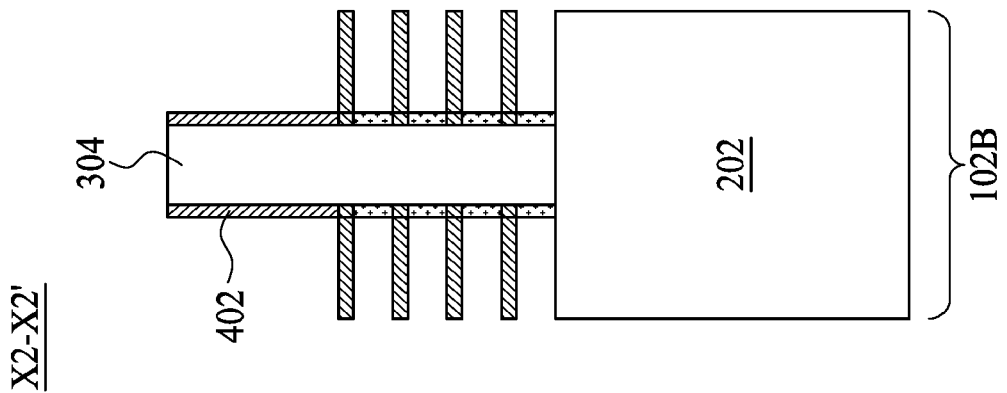
Figure 7B:
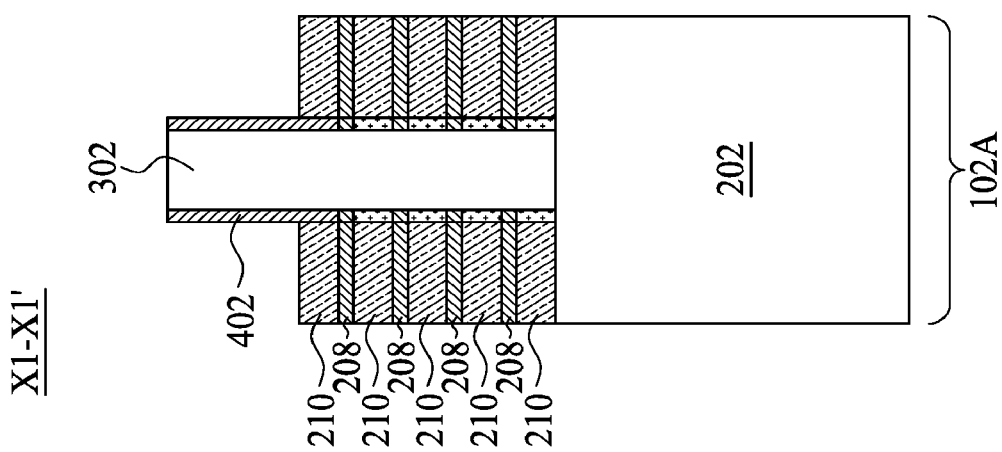

In the depicted embodiments, the first epitaxial structure 210 is grown using the second semiconductor layers 208 as a base, which limits the lateral growth of the first epitaxial structure 210. As shown in FIG. 7A, in an intermediate epitaxial growth stage, each epitaxial layer of the first epitaxial structure 210 grows off a respective S/D second semiconductor layer 208. The lateral growth of the epitaxial layers is limited by the size and shape of the respective second semiconductor layers 208. As the epitaxial layers grow, they merge into a larger first epitaxial structure 210, which has a vertical bar-like shape. In some embodiments, the second semiconductor layers 208 not covered by the dummy gate stacks 302, 304 and the gate spacers 402 are removed, and the first epitaxial structure 210 can thus be grown from the substrate 202.

Another epitaxy process is carried out to grow a second epitaxial structure 212 from the S/D layers 208 in the second FET region 102B, such that the second epitaxial structure 212 wraps around and is in contact with the S/D layers 208 in the second FET region 102B of the device 100. The resulting structure is shown in FIGS. 8A, 8B, 8C, 8D and 8E.

In some embodiments, the grown semiconductor material of the second epitaxial structure 212 may include Ge, Si, GaAs, AlGaAs, SiGe, GaAsP, SiP, or other suitable material. In some embodiments, the second epitaxial structure 212 has a material different than the first epitaxial structure 210. In some embodiments, the material of the second epitaxial structure 212 may be in-situ doped during the epi process. For example, in some embodiments, epitaxially grown material may be doped with boron. In some embodiments, epitaxially grown material may be doped with carbon to form Si:C source/drain features, phosphorous to form Si:P source/drain features, or carbon and phosphorous to form SiCP source/drain features. In some embodiments, the epitaxial material of the second epitaxial structure 212 is silicon and the layer 208 also is silicon. In some embodiments, the second epitaxial structure 212 and the layers 208 may comprise a similar material (e.g., Si), but be differently doped. In other embodiments, the epitaxy layer for the second epitaxial structure 212 includes a first semiconductor material, the epitaxially grown material 208 includes a second semiconductor different than the first semiconductor material. In some embodiments, the epitaxially grown material of the first epitaxial structure 210 is not in-situ doped, and, for example, instead an implantation process is performed. In some embodiments, the first epitaxy structure 210 is doped with n-type dopants (impurities), such as phosphorous, arsenic, other group V elements, or combinations thereof, and the second epitaxy structure 212 is doped with p-type dopants (impurities), such as boron, indium, other group III elements, or combinations thereof. As a result, an NFET can be formed in the first FET region 102A, and a PFET can be formed in the second FET region 102B. Therefore, the first FET region 102A can be referred to as an NFET region 102A, and the second FET region 102B can be referred to as a PFET region 102B.

In some embodiments, the second epitaxial structure 212 is grown by a molecular beam epitaxy (MBE) process, a chemical vapor deposition process, and/or other suitable epitaxial growth processes.

Figure 8A:
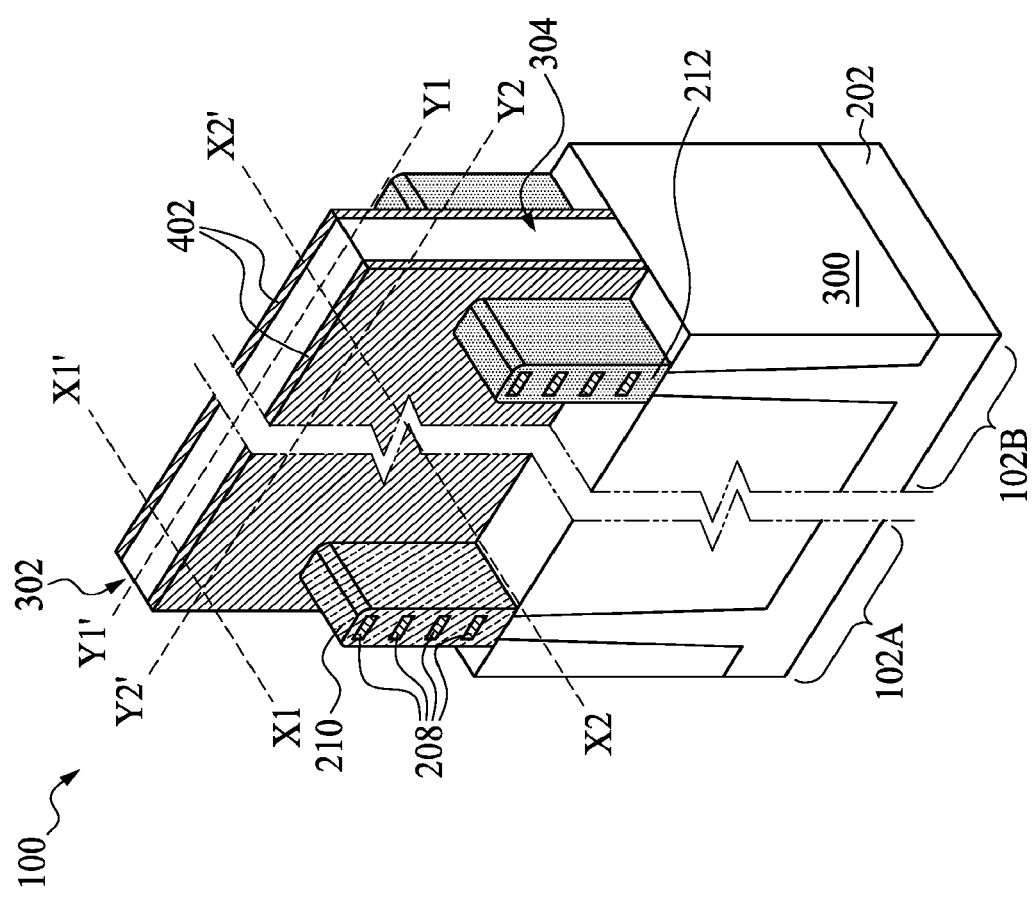
Figure 9A:
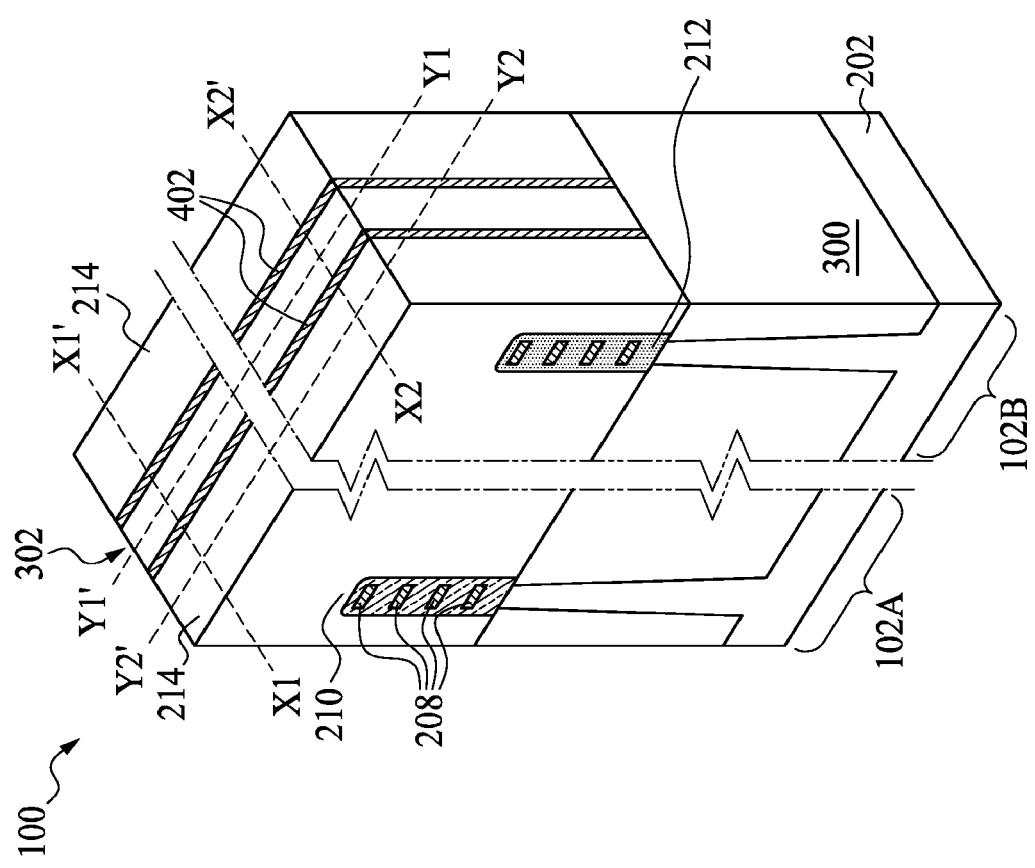
Figure 9B:
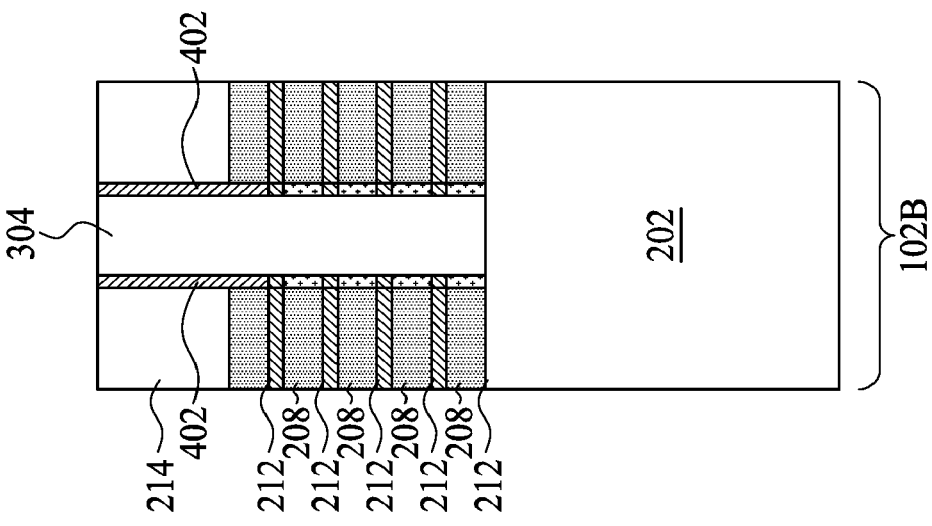
Figure 9C:
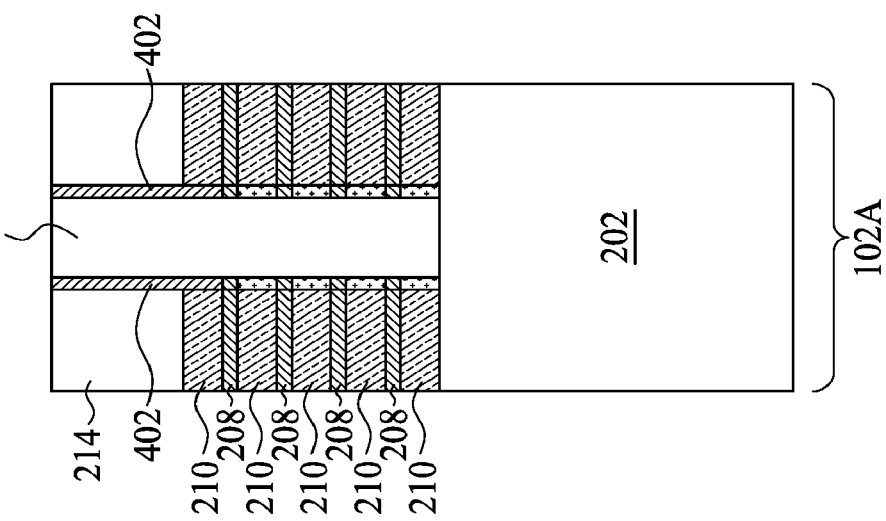
Figure 10A:
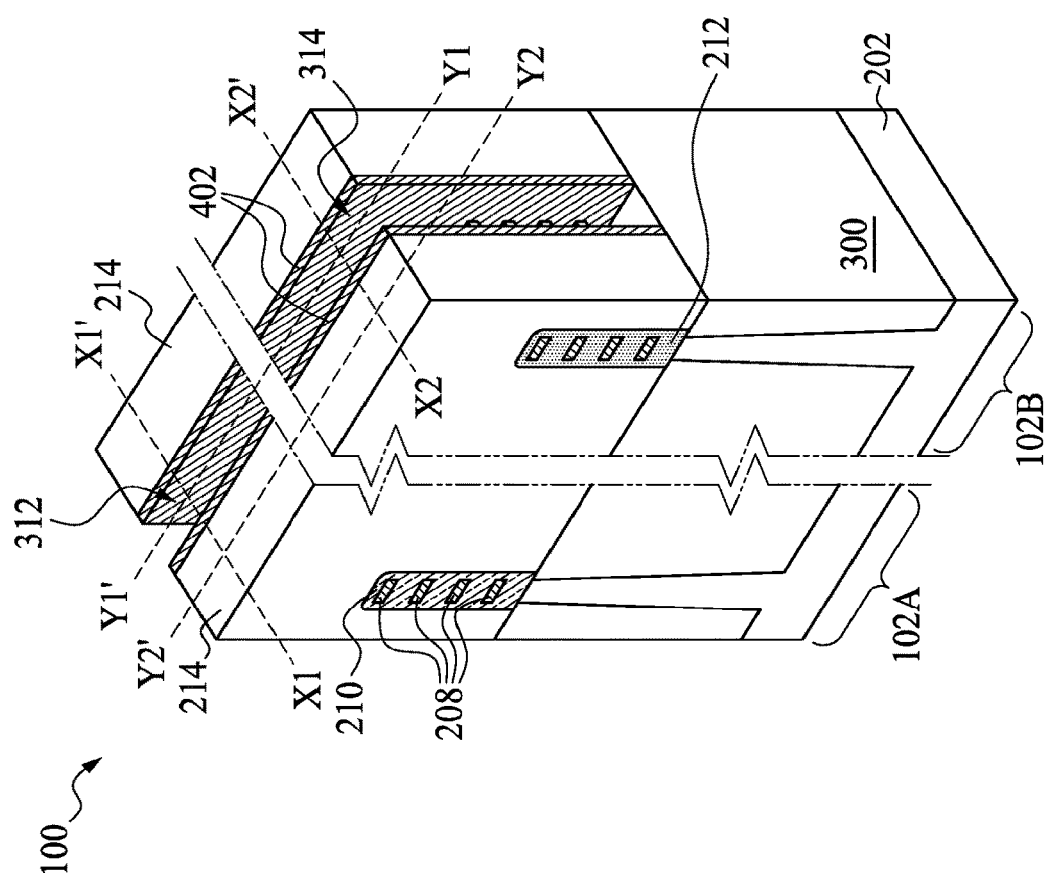
Figure 11A:
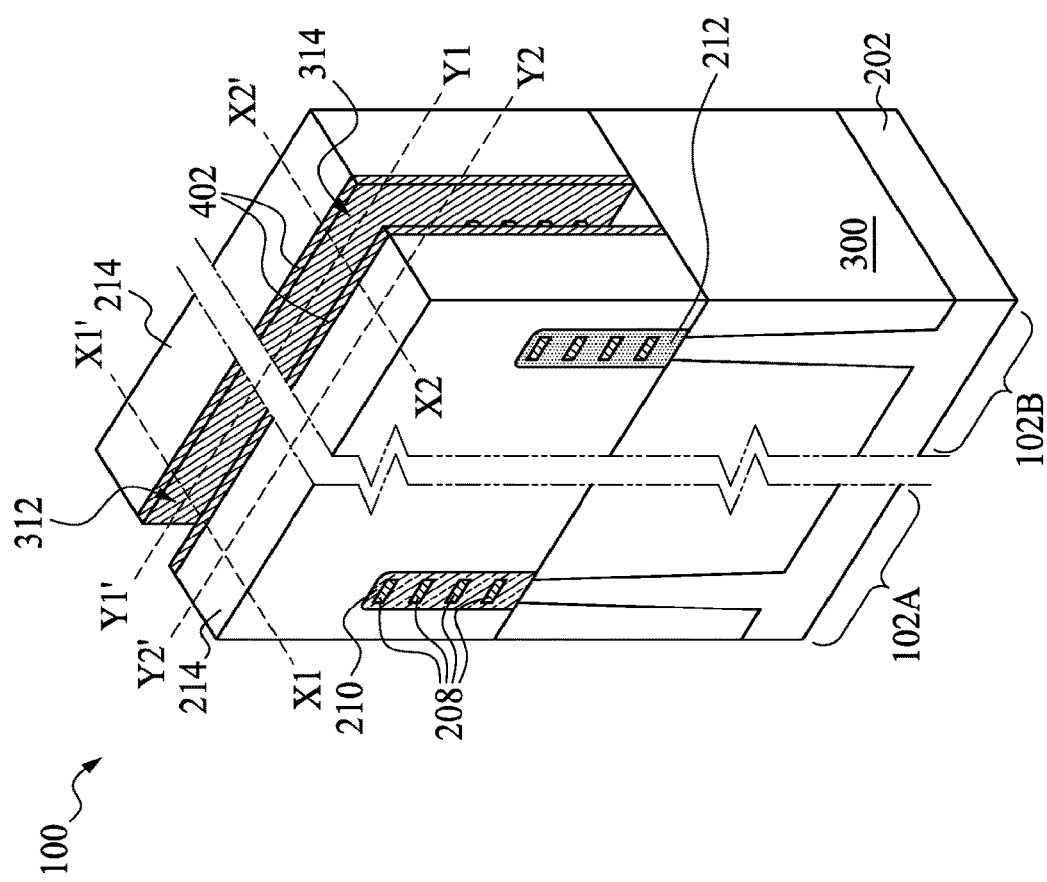
Figure 12A:
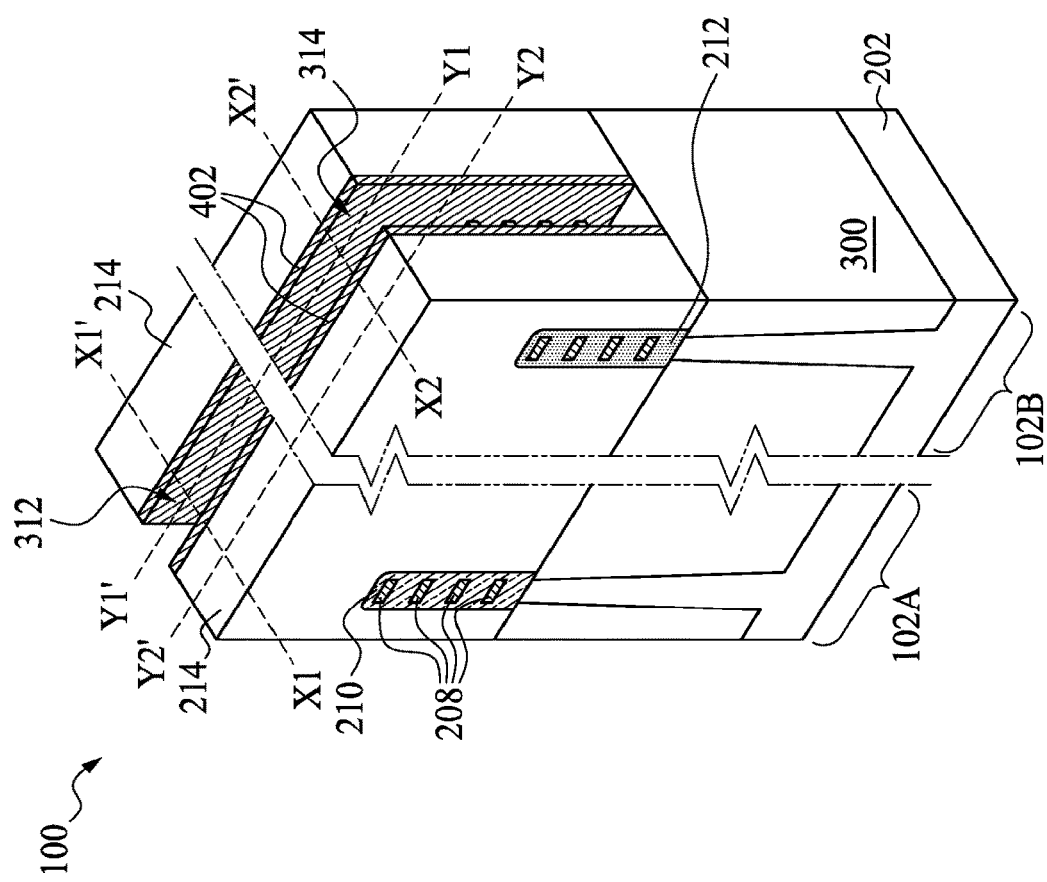

In the depicted embodiments, the second epitaxial structure 220 is grown using the second semiconductor layers 208 as a base, which limits the lateral growth of the second epitaxial structure 220. As shown in FIG. 8A, in an intermediate epitaxial growth stage, each epitaxial layer of the second epitaxial structure 212 grows off a respective S/D second semiconductor layer 208. The lateral growth of the epitaxial layers is limited by the size and shape of the respective second semiconductor layers 208. As the epitaxial layers grow, they merge into a larger second epitaxial structure 212, which has a vertical bar-like shape. In some embodiments, the second semiconductor layers 208 not covered by the dummy gate stacks 302, 304 and the gate spacers 402 are removed, and the second epitaxial structure 212 can thus be grown from the substrate 202.

Reference is made to FIGS. 9A, 9B, 9C, 9D and 9E. An inter-layer dielectric (ILD) layer 214 is formed over the substrate 202. In some embodiments, a contact etch stop layer (CESL) (not shown) is also formed over the substrate 202 prior to forming the ILD layer 214. The CESL may include dielectric material such as silicon nitride, silicon oxide, silicon oxynitride and/or other materials. The CESL may be formed using PECVD, ALD or other suitable deposition or oxidation processes. The ILD layer 214 may include materials such as tetraethylorthosilicate oxide, un-doped silicate glass, or doped silicon oxide such as borophosphosilicate glass, fused silica glass, phosphosilicate glass, boron doped silicon glass, and/or other suitable dielectric materials. The ILD layer 214 may be deposited by a PECVD process, a flowable CVD process, or other suitable deposition technique. In some embodiments, after the CESL and the ILD layer 214 are deposited, a CMP process is performed to planarize the ILD layer 214 with the first and second dummy gates 302 and 304.

Reference is made to FIGS. 10A, 10B, 10C, 10D and 10E. The first and second dummy gate stacks 302 and 304 are removed to expose the channel regions C1 and C2 of the first and second fins 200A and 200B using one or more etching processes, such as wet etching, dry etching, or other suitable etching techniques. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The one or more etching processes form the first and second gate trenches 312 and 314 over the substrate 202.

Reference is made to FIGS. 11A, 11B, 11C, 11D and 11E. The first semiconductor layers 206 exposed by the first gate trench 312 are removed. As a result, portions of the second semiconductor layers 208 in the channel region in the NFET region 102A are suspended in the first gate trench 312. In the following discussion, the portions of the second semiconductor layers 208 suspended in the first gate trench 312 are also referred to as the channel layers (or nanowires) CL1. The channel layers CL1 are slightly etched or not etched. In the present embodiments, the channel layers 208 are slightly etched to form a rod-like shape (e.g., a nanowire) (see FIG. 11D). In some embodiments, the channel layers CL1 (FIG. 11D) in the gate trench 312 and the S/D layers 208 (FIG. 11E) outside the gate trench 312 may have same or different cross-sectional profiles. In some embodiments, the first semiconductor layers 206 are removed by a selective etching process in which a etch rate of the first semiconductor layers 206 is higher than that of the second semiconductor layers 208. For example, in some embodiments where the first semiconductor layer 206 is SiGe and the second semiconductor layer 208 is Si, the etch rate of SiGe is higher than that of Si in this selective etching process. During the etching process, the PFET region 102B can be protected by a mask (not shown).

As a result of this etching process, the channel layer CL1 in channel region C1 has a width W1 and a height H1 less than the width W1. In some embodiments, the width W1 of the channel layer CL1 is in a range from about 2 nm to about 60 nm. For example, the width W1 of the channel layer CL1 is in a range from about 6 nm to about 50 nm. In some embodiments, the height H1 of the channel layer CL1 is in a range from about 2 nm to about 20 nm. In particular, the height H1 of the channel layer CL1 is in a range from about 6 nm to about 10 nm.

Reference is made to FIGS. 12A, 12B, 12C, 12D and 12E. An etching process is carried out to the first and second semiconductor layers 208 exposed by the gate trench 314, so that the first and second semiconductor layers 206 and 208 are trimmed as channel layers CL2 and CL2 in the PFET region 102B. In some embodiments where the first semiconductor layer 206 is SiGe and the second semiconductor layer 208 is Si, the etch rate of Si is higher than that of SiGe in this etching process, so that Si is removed more than SiGe in this selective etching process. Therefore, the channel layers CL3 (made of Si) are narrower than the channel layers CL2 (made of SiGe), and hence the channel region C2 includes more SiGe than Si. As a result of the selective etching process, the SiGe channel layer CL2 in the PFET region 102B has a width W2 and a height H2 greater than the width W2, and the remaining Si channel layer CL3 in the PFET region 102B has a width W3 less than the width W2 and a height H3 less than the height H2. In some embodiments, the width W2 of the SiGe channel layer CL2 in the PFET region 102B is in a range from about 5 nm to about 30 nm, for example, in a range from about 5 nm to about 20 nm. In some embodiments, the height H2 of the SiGe channel layer CL2 is in a range from about 6 nm to about 30 nm. In some embodiments, the width W3 of the Si channel layer CL3 is in a range from about 0 nm to about 20 nm, and the height H3 of the Si channel layer CL3 is in a range from about 6 nm to about 20 nm, for example, in a range from about 6 nm to about 10 nm. Furthermore, in some embodiments, the height H1 of the Si channel layer CLI in the NFET region 102A is the same as the height H3 of the Si channel layer CL3 in the PFET region 102B. In other embodiments, the distance between the neighboring Si channel layers CL1 in the NFET region 102A is equal to the height H2 of the SiGe channel layer CL2 in the PFET region 102B.

Referring again to FIG. 12D. The horizontal surfaces of the Si channel layer CL1 in the NFEP region 102A has a (100) surface orientation. The electron mobility of Si with (100) crystallographic orientation, Si (100), is higher than that of Si (110). This allows horizontal surfaces of the Si channel layer CL1, also referred to as Si (100) surfaces, to have better electron mobility than that of vertical sidewalls of the Si channel layer CL1, which are referred to Si (110) surfaces. As mentioned above, the width W1 of the Si channel layer CL1 in the NFET region 102A is greater than the height H1 of the Si channel layer CL1 in the NFET region 102A. Therefore, the horizontal surfaces of the Si channel layer CL1 have surface area greater than that of the vertical sidewalls of the Si channel layer CL1, and hence improved electron mobility can be provided in the NFET region 102A.

The vertical sidewalls of the SiGe channel layer CL2 in the PFET region 102B has a (110) surface orientation. The hole mobility of SiGe with (110) crystallographic orientation, SiGe (110), is higher than that of SiGe (100). This allows vertical sidewalls of the SiGe channel layer CL2, also referred to as SiGe (110) surfaces, to have better hole mobility than that of horizontal surfaces of the SiGe channel layer CL2, which are referred to SiGe (100) surfaces. As mentioned above, the height H2 of the SiGe channel layer CL2 is greater than the width W2 of the SiGe channel layer CL2. Therefore, the vertical sidewalls of the SiGe channel layer CL2 have surface area greater than that of the horizontal surfaces of the SiGe channel layer CL2, and hence improved hole mobility can be provided in the PFET region 102B. As a result, improved carrier mobility can be achieved in either NFET region 102A or PFET region 102B because of the thickness difference between the first and second semiconductor layers 206 and 208.

Figure 13A:
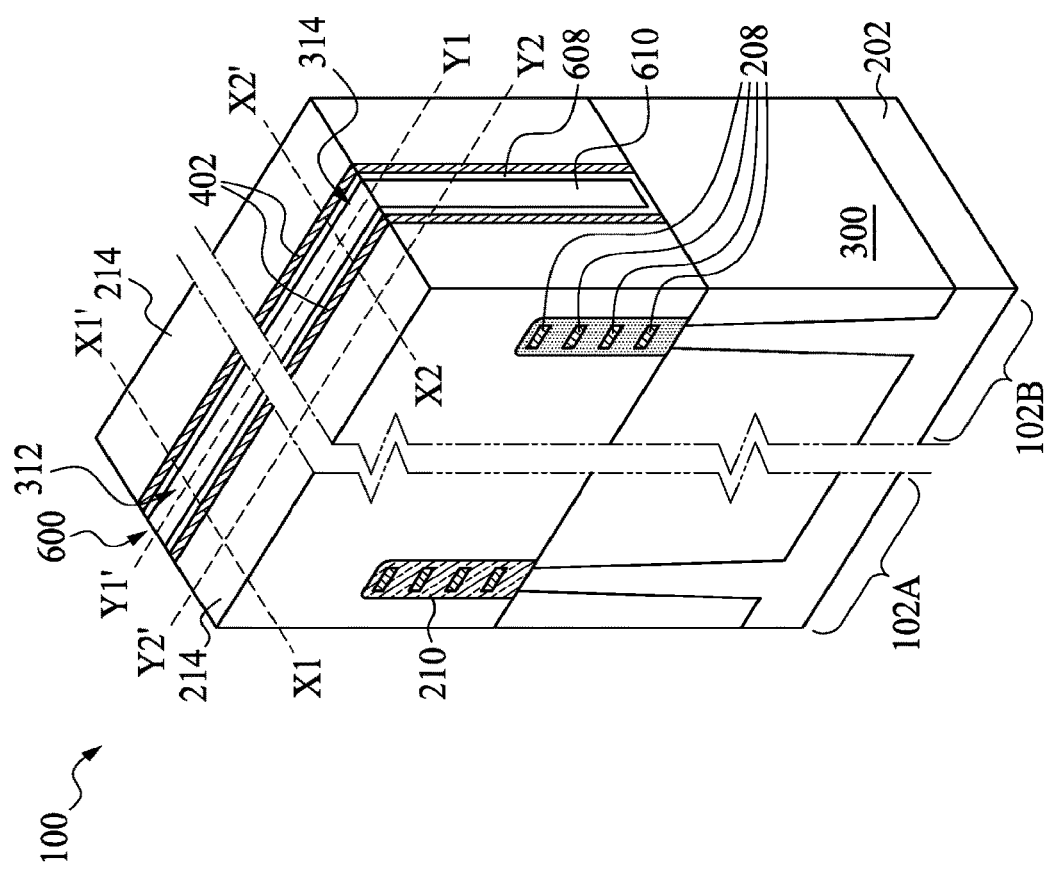
Figure 13C:
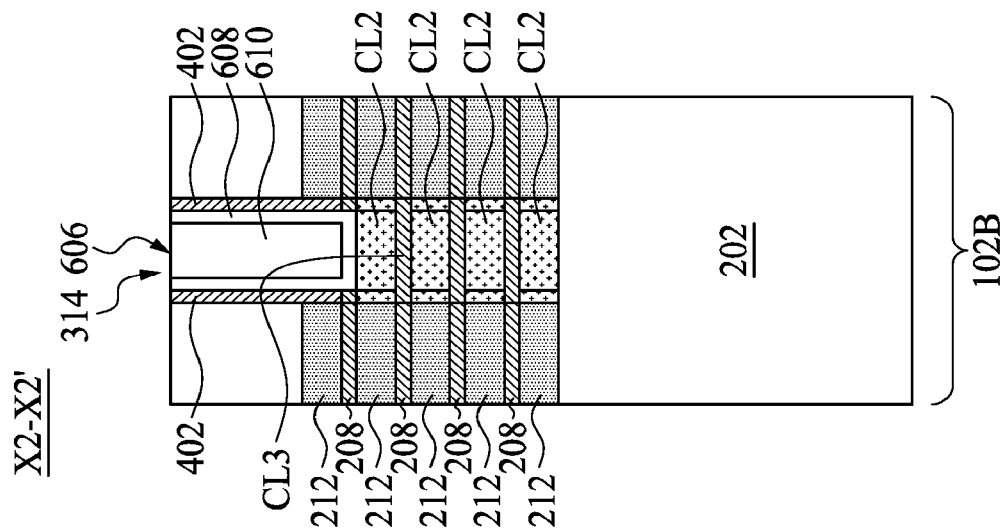
Figure 13B:
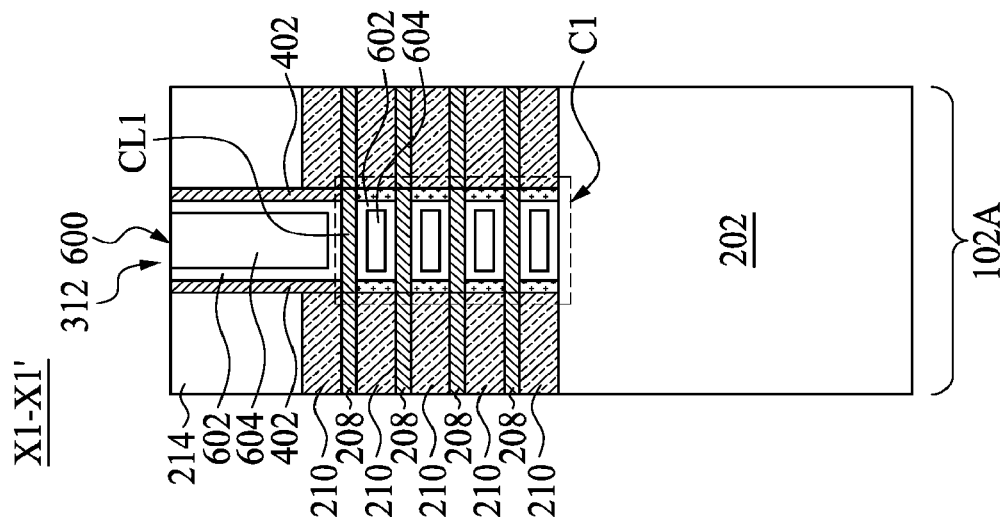

Reference is made to FIGS. 13A, 13B, 13C, 13D and 13E. A first gate stack 600 and a second gate stack 606 are formed in the respective gate trenches 312 and 314. The first and second gate stacks 600 and 606 fill the first and second gate trenches 312 and 314 (as shown in FIGS. 13B and 13C). The first gate stack 600 includes a gate metal layer 604 and a gate dielectric layer 602 between the Si channel layer CL1 and the gate metal layer 604. The second gate stack 606 includes a gate metal layer 610 and a gate dielectric layer 608 between the SiGe channel layer CL2 and the gate metal layer 610.

In some embodiments, the gate dielectric layers 602 and 608 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layers 602 and 608 may include hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layers 602 and 608 may have a multilayer structure such as one layer of silicon oxide (e.g., interfacial layer) and another layer of high-k material.

The gate metal layers 604 and 610 may include work function metals to provide a suitable work function for the gate stacks 600 and 606. For example, the gate metal layer 604 may include one or more n-type work function metals (N-metal) for forming an NFET in the NFET region 102A. The n-type work function metals may exemplarily include, but are not limited to, titanium aluminide (TiAl), titanium aluminum nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, the gate metal layer 610 may include one or more p-type work function metals (P-metal) for forming a PFET on the PFET region 102B. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The gate metal layers 604 and 610 may further include filling metals respectively filling recesses in the work function metals. The filling metals may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate stacks 600 and 606 may include forming a blanket gate dielectric layer over the structure shown in FIG. 12, forming one or more work function conductor layers over the blanket gate dielectric layer, forming a filling conductor layer over the work function conductor layers, wherein some portions of the filling conductor layer overfill the gate trenches 312 and 316, and performing a CMP process to remove excessive materials of the filling conductor layer, the work function conductor layers and the gate dielectric layer outside the gate trenches 314 and 316.

Further, some processes are performed to complete the fabrication of the device 100. For example, it may form contact openings, contact metal, as well as various contacts, vias, wires, and multilayer interconnect features (e.g., metal layers and interlayer dielectrics) over the substrate 202, configured to connect the various features to form a functional circuit that may include one or more multi-gate devices. In particular, it may form a contact metal penetrating through the ILD layer 214 and contacting the first and second epitaxial structures 210 and 212.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that improved electron mobility can be provided for the NFET device because the horizontal surfaces of Si channel layers (i.e. Si (100) surfaces) have greater surface area than that of vertical sidewalls of the Si channel layers (i.e. Si (110) surfaces). Another advantage is that improved hole mobility can be provided for the PFET device because the vertical sidewalls of the SiGe channel layers (i.e. SiGe (110) surfaces) have greater surface area than that of horizontal surfaces of the SiGe channel layers (i.e. SiGe (100) surfaces). Yet another advantage is that the improved carrier mobility for NFET and PFET devices can be achieved by a simplified process using thickness difference between semiconductor layers stacked on the substrate. Yet another advantage is that short channel effect for the n-type gate-all-around (GAA) device can be alleviated since the Si channel layers are separated by an increased distance on account of removal of thickened SiGe layers.

In some embodiments, a device includes a substrate, a stacked structure and a first gate stack. The stacked structure includes a plurality of first semiconductor layers and a plurality of second semiconductor layers alternately stacked over the substrate. One of the first semiconductor layers has a height greater than a height of one the second semiconductor layers. The first gate stack wraps around the stacked structure.

In some embodiments, a device includes a substrate, a plurality of nanowires and a gate stack. The nanowires are disposed on the substrate and extend in a first direction on the substrate. The nanowires are arranged in a second direction substantially perpendicular to the first direction. Neighboring two of the nanowires are separated by a distance greater than a height of one of the nanowires. The gate stack wraps around the nanowires.

In some embodiments, a method includes forming a stacked structure of a plurality of first semiconductor layers and a plurality of second semiconductor layers alternately stacked in a first direction over a substrate, the first semiconductor layers being thicker than the second semiconductor layers, patterning the stacked structure into a first fin structure and a second fin structure extending along a second direction substantially perpendicular to the first direction, removing the first semiconductor layers of the first fin structure and forming a first gate structure between the second semiconductor layers of the first fin structure.

In some embodiments, a method includes forming a stacked structure of a plurality of first semiconductor layers and a plurality of second semiconductor layers alternately stacked in a first direction over a substrate, the first semiconductor layers being thicker than the second semiconductor layers. The method also includes patterning the stacked structure into a first fin structure and a second fin structure extending along a second direction substantially perpendicular to the first direction. The method further includes removing the first semiconductor layers of the first fin structure to form a plurality of nanowires. Each of the nanowires has a first height, there is a distance between two adjacent nanowires along the vertical direction, and the distance is greater than the first height. The method includes forming a first gate structure between the second semiconductor layers of the first fin structure.

In some embodiments, a method includes forming a stacked structure of a plurality of silicon germanium layers and a plurality of silicon layers alternately stacked in a vertical direction over a substrate, the silicon germanium layers being thicker than the silicon layers. The method includes patterning the stacked structure into a first fin structure and a second fin structure, and removing the silicon germanium of the first fin structure to form a plurality of nanowires. The method also includes trimming the silicon germanium layers and the silicon layers of the second fin structure to form a plurality of silicon germanium channel layers and a plurality of silicon channel layers. A bottommost one of the nanowires of the first fin structure is higher than a bottommost one of the silicon germanium channel layers of the second fin structure.

In some embodiments, a method includes forming a stacked structure of a plurality of silicon germanium layers and a plurality of silicon layers alternately stacked in a vertical direction over a substrate, the silicon germanium layers being thicker than the silicon layers. The method includes patterning the stacked structure into a first fin structure and a second fin structure, and forming a first dummy gate stack on the first fin structure and a second dummy gate stack on the second fin structure. The method includes forming a spacer layer on a sidewall of the first dummy gate stack and the second dummy gate stack, and removing a portion of the silicon germanium layers of the first fin structure in a S/D region. The method further includes forming an S/D structure to wrap around the silicon layers of the first fin structure, and trimming the silicon germanium layers and the silicon layers of the second fin structure to form a plurality of silicon germanium channel layers and a plurality of silicon channel layers. The method includes forming a second gate structure on the silicon germanium channel layers and the silicon channel layers, and each of the silicon germanium layers has a first height, each of the silicon channel layers has a second height, and the first height is greater than the second height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a stacked structure of a plurality of first semiconductor layers and a plurality of second semiconductor layers alternately stacked in a first direction over a substrate, the first semiconductor layers being thicker than the second semiconductor layers;

patterning the stacked structure into a first fin structure and a second fin structure extending along a second direction substantially perpendicular to the first direction;

removing the first semiconductor layers of the first fin structure to form a plurality of silicon nanowires, wherein each of the silicon nanowires has a first height, there is a distance between two adjacent silicon nanowires along the vertical direction, and the distance is greater than the first height;

forming an S/D structure to wrap around the second semiconductor layers of the first fin structure; and forming a first gate structure between the silicon nanowires of the first fin structure, wherein a portion of the first gate structure is lower than a bottommost one of the silicon nanowires and higher than a bottom surface of the S/D structure.

2. The method of claim 1, further comprising:
trimming the second semiconductor layers of the second fin structure to form trimmed second semiconductor layers, such that the first semiconductor layers of the second fin structure are wider than the trimmed second semiconductor layers; and forming a second gate structure wrapping the second fin structure after the trimming.

3. The method of claim 1, wherein each of the silicon nanowires has a first width, the method further comprising:
trimming the first semiconductor layers and the second semiconductor layers of the second fin structure to form trimmed first semiconductor layers and trimmed second semiconductor layers, such that each of the trimmed first semiconductor layers has a second width, each of the trimmed second semiconductor layers has a third width, the first width is greater than the second width, and the second width is greater than the third width.

4. The method of claim 3, wherein a topmost one of the silicon nanowires is higher than a topmost one of the trimmed first semiconductor layers.

5. The method of claim 3, wherein a bottommost one of the silicon nanowires is higher than a bottommost one of the trimmed first semiconductor layers.

6. The method of claim 1, further comprising:
removing a portion of the first semiconductor layers of the first fin structure in a S/D region; and
forming the S/D structure to wrap around the second semiconductor layers of the first fin structure.

7. The method of claim 1, further comprising:
trimming the first semiconductor layers and the second semiconductor layers of the second fin structure to form a plurality of first channel layers and a plurality of second channel layers; and
forming a gate dielectric layer on the first channel layers and the second channel layers, wherein the gate dielectric layer is in direct contact with the first channel layers and the second channel layers.

8. The method of claim 1, wherein the first semiconductor layers are made of silicon germanium, the second semiconductor layers are made of silicon, the method comprises:
trimming the silicon germanium layers and the silicon layers of the second fin structure to form a plurality of silicon germanium channel layers and a plurality of silicon layers, wherein each of the silicon germanium layers has a first width and a first height, each of the silicon layers has a second width and a second height, the first width is greater than the second width, and the first height is greater than the second height.

9. The method of claim 8, wherein each of the silicon layers in the first fin structures has a third width, and the third width is greater than the first width.

10. The method of claim 8, wherein each of the silicon layers in the first fin structures has a third height, and the third height is smaller than the first height.

11. A method, comprising:
forming a stacked structure of a plurality of silicon germanium layers and a plurality of silicon layers alternately stacked in a vertical direction over a substrate, the silicon germanium layers being thicker than the silicon layers;

patterning the stacked structure into a first fin structure and a second fin structure;

removing the silicon germanium of the first fin structure to form a plurality of nanowires; and trimming the silicon germanium layers and the silicon layers of the second fin structure to form a plurality of silicon germanium channel layers and a plurality of silicon channel layers, wherein a bottommost one of the nanowires of the first fin structure is higher than a bottommost one of the silicon germanium channel layers of the second fin structure.

12. The method of claim 11, further comprising:
forming a first gate structure between the nanowires; and
forming a second gate structure on the silicon channel layers and the silicon germanium channel layers.

13. The method of claim 11, further comprising:
removing a portion of the silicon germanium layers of the first fin structure in a S/D region; and
forming an S/D structure to wrap around the silicon layers of the first fin structure.

14. The method of claim 11, wherein each of the silicon germanium channel layers has a first width and a first height, each of the silicon channel layers has a second width and a second height, the first width is greater than the second width, and the first height is greater than the second height.

15. The method of claim 14, wherein each of the nanowires has a third width and a third height, and the third width is greater than the first width, and the third height is smaller than the first height.

16. The method of claim 11, further comprising:
forming a dummy gate stack on the first fin structure;
forming a spacer layer on a sidewall of the dummy gate stack; and
removing a portion of the silicon germanium layers while another portion of silicon germanium layers directly below the spacer layer are remaining.

17. A method, comprising:
forming a stacked structure of a plurality of silicon germanium layers and a plurality of silicon layers alternately stacked in a vertical direction over a substrate, the silicon germanium layers being thicker than the silicon layers;

patterning the stacked structure into a first fin structure and a second fin structure;

forming a first dummy gate stack on the first fin structure and a second dummy gate stack on the second fin structure;

forming a spacer layer on a sidewall of the first dummy gate stack and the second dummy gate stack;

removing a portion of the silicon germanium layers of the first fin structure in a S/D region;

forming an S/D structure to wrap around the silicon layers of the first fin structure;

trimming the silicon germanium layers and the silicon layers of the second fin structure to form a plurality of silicon germanium channel layers and a plurality of silicon channel layers; and forming a second gate structure on the silicon germanium channel layers and the silicon channel layers, wherein each of the silicon germanium layers has a first height and a first width, each of the silicon channel layers has a second height and a second width, the first height is greater than the second height, and the first width is greater than the second width.

18. The method of claim 17, wherein after removing the portion of the silicon germanium layers of the first fin structure in the S/D region, another portion of the silicon germanium layers of the first fin structure which is directly below the spacer layer is not removed.

19. The method of claim 17, further comprising:

removing the silicon germanium of the first fin structure to form a plurality of nanowires; and forming a first gate structure between the nanowires.

20. The method of claim 19, wherein a bottommost one of the nanowires of the first fin structure is higher than a bottommost one of the silicon germanium channel layers of the second fin structure.

* * * * *